(12) United States Patent
Sreenivasan et al.

(10) Patent No.: US 12,094,775 B2
(45) Date of Patent: Sep. 17, 2024

(54) NANOSCALE-ALIGNED THREE-DIMENSIONAL STACKED INTEGRATED CIRCUIT

(71) Applicant: Board of Regents, The University of Texas System, Austin, TX (US)

(72) Inventors: Sidlgata V. Sreenivasan, Austin, TX (US); Paras Ajay, Austin, TX (US); Aseem Sayal, Austin, TX (US); Ovadia Abed, Austin, TX (US); Mark McDermott, Austin, TX (US); Jaydeep Kulkarni, Austin, TX (US); Shrawan Singhal, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 85 days.

(21) Appl. No.: 18/081,047

(22) Filed: Dec. 14, 2022

(65) Prior Publication Data

US 2023/0116581 A1    Apr. 13, 2023

Related U.S. Application Data

(63) Continuation of application No. 16/957,046, filed as application No. PCT/US2018/067322 on Dec. 21, 2018, now Pat. No. 11,600,525.
(Continued)

(51) Int. Cl.
*H01L 21/768* (2006.01)
*H01L 23/00* (2006.01)
(Continued)

(52) U.S. Cl.
CPC ...... *H01L 21/76898* (2013.01); *H01L 23/481* (2013.01); *H01L 23/5386* (2013.01);
(Continued)

(58) Field of Classification Search
CPC ............ H01L 21/76898; H01L 23/481; H01L 23/5386
See application file for complete search history.

(56) References Cited

U.S. PATENT DOCUMENTS 8,581,349 B1 * 11/2013 Sekar ................. H01L 21/6835
257/E23.168
9,164,969 B1    10/2015 Gumaste et al.
(Continued)

FOREIGN PATENT DOCUMENTS

CN    103021960 A    4/2013
JP    2006041502 A    2/2006
(Continued)

OTHER PUBLICATIONS

Notice of Preliminary Rejection for Korean Patent Application No. 10-2020-7021314 dated Apr. 16, 2024, pp. 1-6.
(Continued)

*Primary Examiner* — Dale E Page
*Assistant Examiner* — Wilner Jean Baptiste
(74) *Attorney, Agent, or Firm* — Shackelford, McKinley & Norton, LLP; Robert A. Voigt, Jr.

(57) ABSTRACT

A method for fabricating a three-dimensional (3D) stacked integrated circuit. Pick-and-place strategies are used to stack the source wafers with device layers fabricated using standard two-dimensional (2D) semiconductor fabrication technologies. The source wafers may be stacked in either a sequential or parallel fashion. The stacking may be in a face-to-face, face-to-back, back-to-face or back-to-back fashion. The source wafers that are stacked in a face-to-back, back-to-face or back-to-back fashion may be connected using Through Silicon Vias (TSVs). Alternatively, source wafers that are stacked in a face-to-face fashion may be connected using Inter Layer Vias (ILVs).

65 Claims, 26 Drawing Sheets

Related U.S. Application Data

(60) Provisional application No. 62/609,891, filed on Dec. 22, 2017.

(51) Int. Cl.
*H01L 23/48* (2006.01)
*H01L 23/538* (2006.01)
*H01L 23/544* (2006.01)
*H01L 25/00* (2006.01)
*H01L 25/065* (2023.01)
*H01L 27/06* (2006.01)

(52) U.S. Cl.
CPC .......... *H01L 23/544* (2013.01); *H01L 24/83* (2013.01); *H01L 24/95* (2013.01); *H01L 25/0657* (2013.01); *H01L 25/50* (2013.01); *H01L 27/0688* (2013.01); *H01L 2224/32145* (2013.01); *H01L 2224/8013* (2013.01); *H01L 2224/95001* (2013.01); *H01L 2225/06544* (2013.01); *H01L 2924/1437* (2013.01)

(56) References Cited

U.S. PATENT DOCUMENTS

| | | | |
|---|---|---|---|
| 9,190,392 | B1 | 11/2015 | Shinde et al. |
| 9,640,531 | B1 | 5/2017 | Or-Bach et al. |
| 2009/0212407 | A1 | 8/2009 | Foster et al. |
| 2010/0047053 | A1* | 2/2010 | Burke ............... H01L 21/67259 414/787 |
| 2010/0248424 | A1 | 9/2010 | Luce et al. |
| 2015/0163926 | A1 | 6/2015 | Huang |
| 2016/0232271 | A1 | 8/2016 | Lim et al. |
| 2016/0276019 | A9 | 9/2016 | Lin et al. |
| 2017/0077007 | A1 | 3/2017 | Suthiwongsunthorn et al. |
| 2017/0294415 | A1 | 10/2017 | Or-Bach |

FOREIGN PATENT DOCUMENTS

| | | | |
|---|---|---|---|
| JP | 2007216895 | A | 8/2007 |
| JP | 2016502287 | A | 1/2016 |
| JP | 2016513674 | A | 5/2016 |
| JP | 2018511928 | A | 4/2018 |
| KR | 10-2007-0039559 | A | 4/2007 |
| WO | 2014046052 | A1 | 3/2014 |
| WO | 2014136241 | A1 | 2/2017 |
| WO | 2018119451 | A1 | 6/2018 |

OTHER PUBLICATIONS

Office Action for Chinese Patent Application No. 201880090163.X dated Apr. 19, 2024, pp. 1-8.
International Search Report for International Application No. PCT/US2018/067322 dated Mar. 4, 2019, pp. 1-2.
Written Opinion of the International Searching Authority for International Application No. PCT/US2018/067322 dated Mar. 4, 2019, pp. 1-9.
Notice of Decision of Final Rejection for Japanese Patent Application No. 2020-565259 dated Dec. 5, 2022, pp. 1-6.
Partial Supplementary European Search Report for European Patent Application No. 18 890 194.6 dated Aug. 13, 2021, pp. 1-14.
Extended European Search Report for European Patent Application No. 18 890 194.6 dated Nov. 16, 2021, pp. 1-13.
Notice of Reasons for Refusal for Japanese Patent Application No. 2020-565259 dated Jun. 28, 2022, pp. 1-7.
Notice of Reasons for Refusal for Japanese Patent Application No. 2023-061381 dated Apr. 26, 2024, pp. 1-6.

* cited by examiner

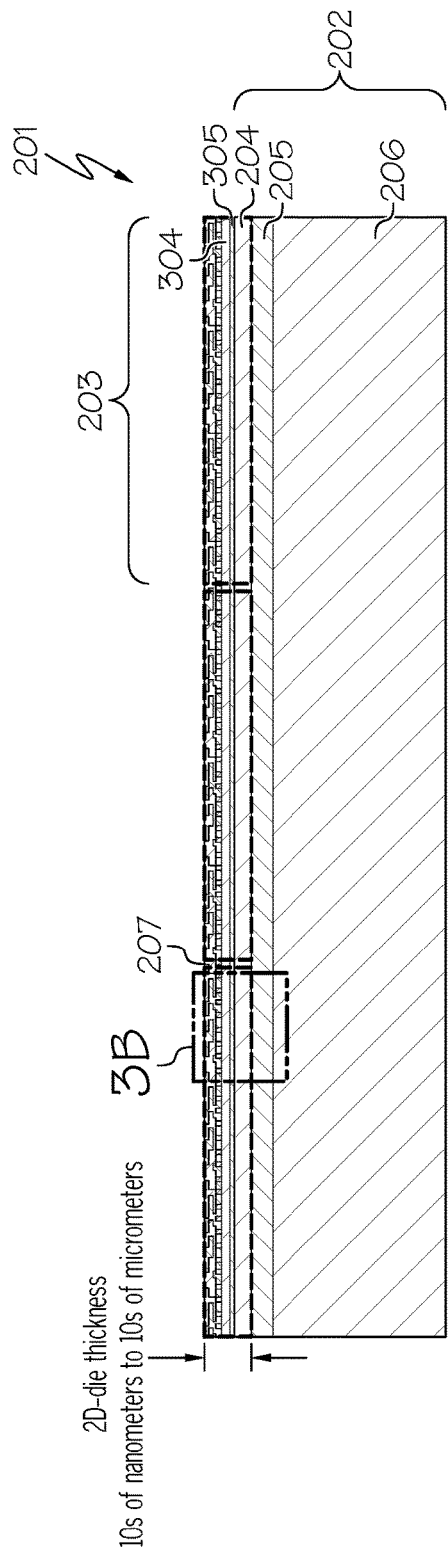
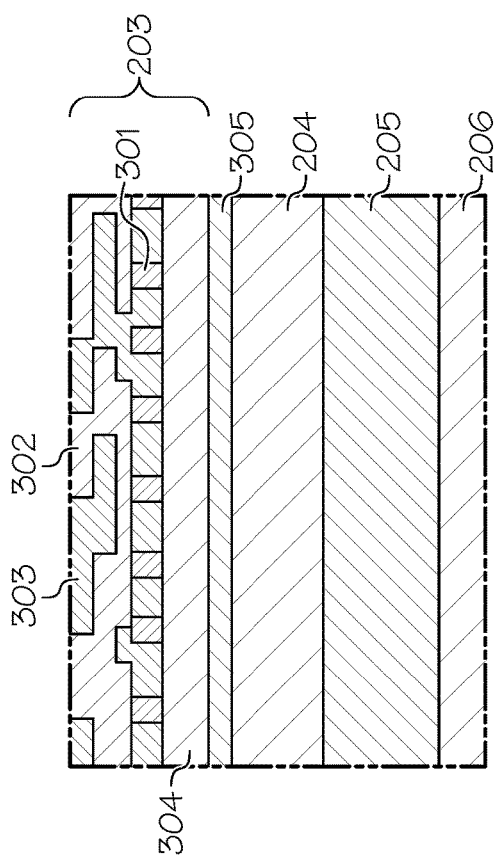
FIG. 3A
FIG. 3B

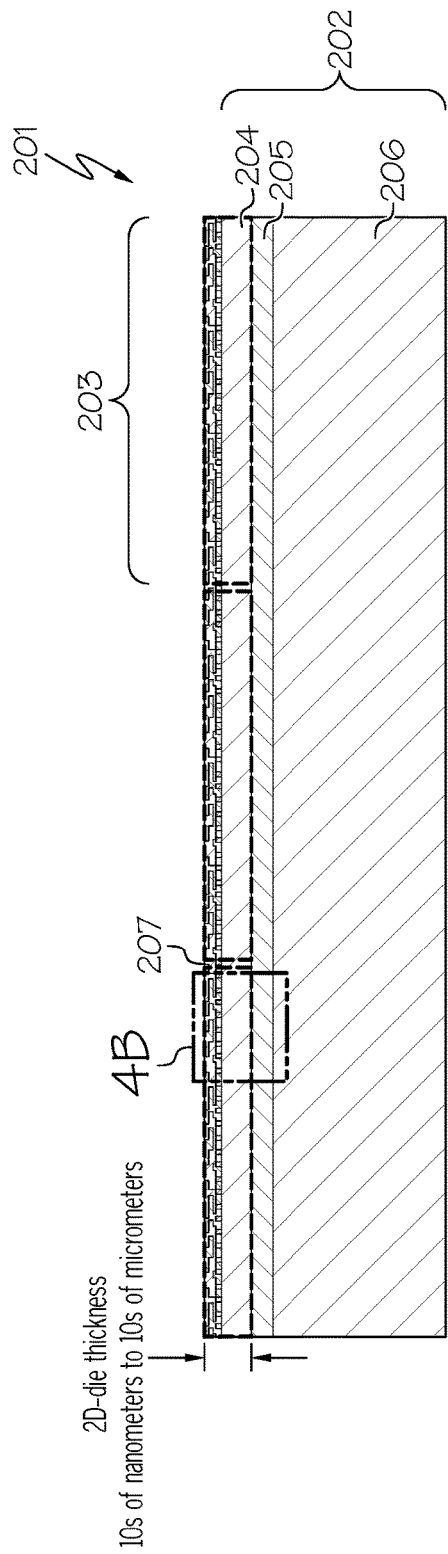
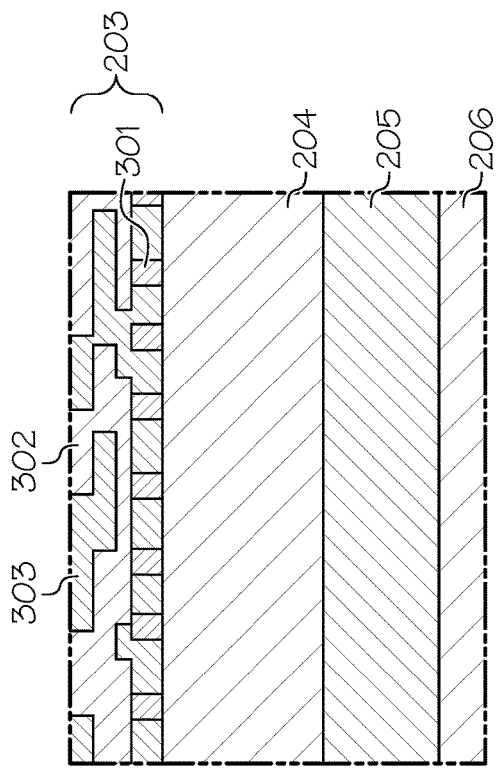
FIG. 4A
FIG. 4B

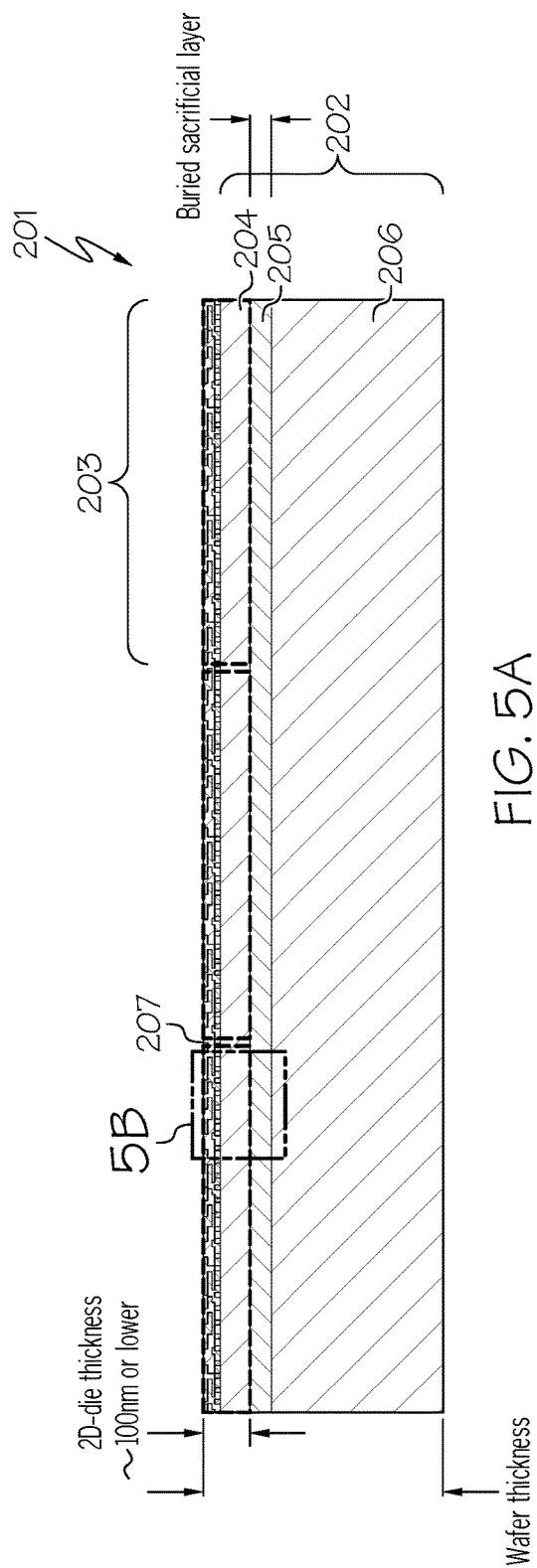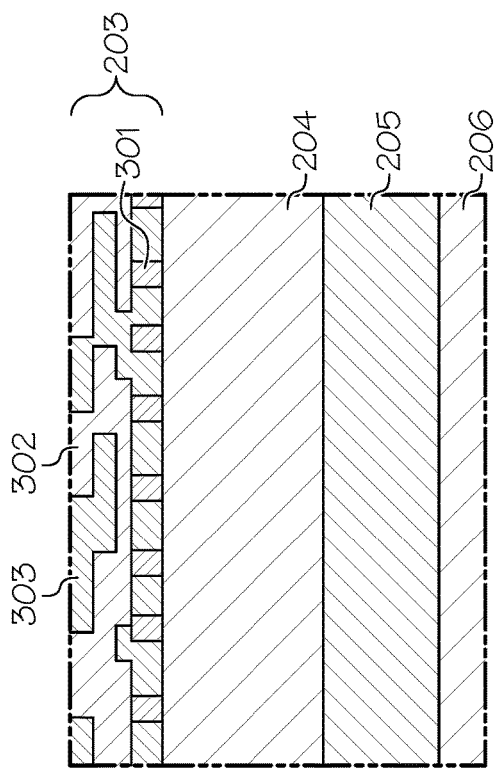
FIG. 5A
FIG. 5B

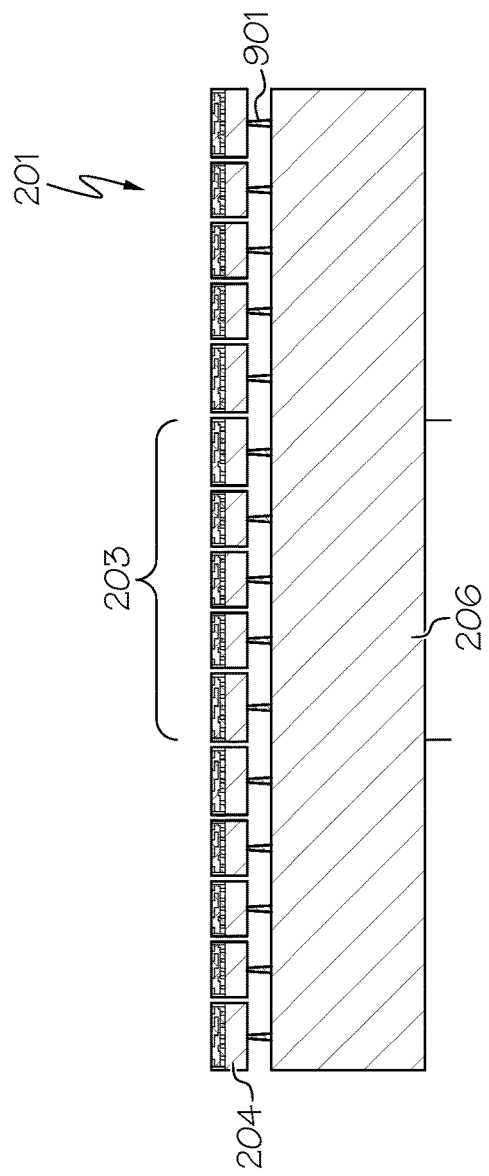
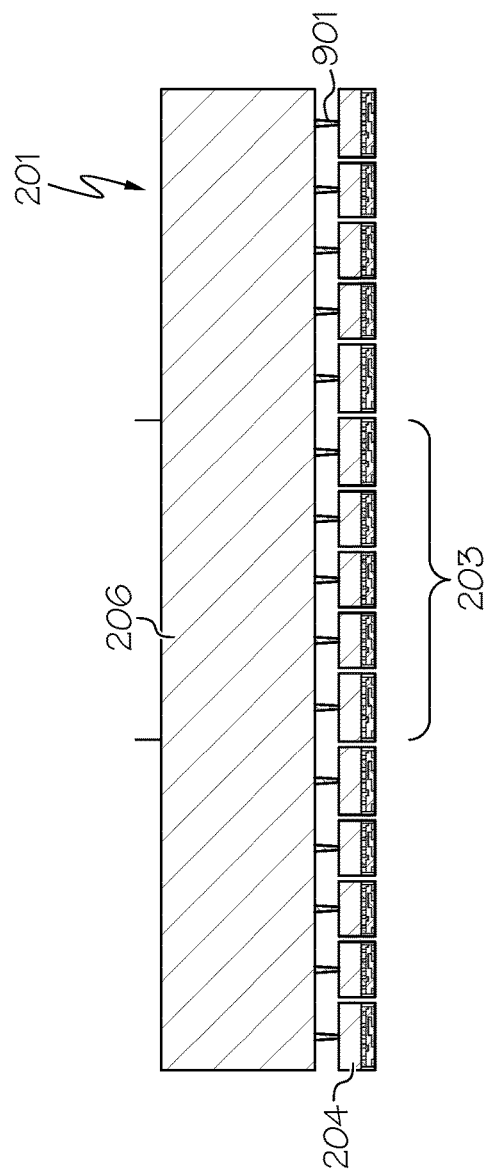
FIG. 9C
FIG. 9D

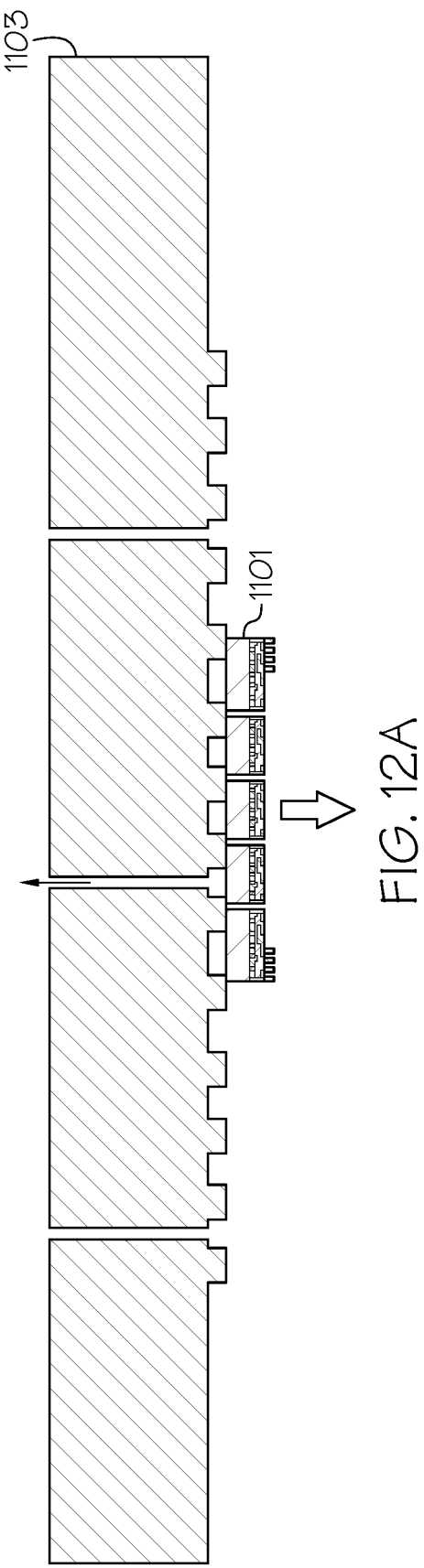

NANOSCALE-ALIGNED THREE-DIMENSIONAL STACKED INTEGRATED CIRCUIT

TECHNICAL FIELD

The present invention relates generally to semiconductor fabrication, and more particularly to a nanoscale-aligned three-dimensional (3D) stacked integrated circuit.

BACKGROUND

Moore's law is the observation that the number of transistors in a dense integrated circuit doubles about every two years. Two-dimensional (2D) scaling of electronic circuits, as characterized by Moore's law, may now have reached a limit in recent times as feature dimensions have reached atomic scales. For instance, the thickness of high-K capping layers for 10 nm technology nodes is close to 0.5 nm, which is less than the width of two silicon atoms. The metrology precision requirements for multi-patterning technologies (MPT) are close to 0.2 nm which is less than the width of one silicon atom.

In light of these and other limitations, 2D scaling and general top down fabrication have significant challenges in continuing at and beyond the 7 nm node.

SUMMARY

In one embodiment of the present invention, a method for assembling die onto a product substrate comprises selectively picking one or more die from a source wafer by a superstrate attached to the one or more die. The method further comprises placing and bonding the selectively picked one or more die onto the product substrate with precision overlay, where the precision overlay is enabled by a fluid deployed between the one or more die and the product substrate, and where the precision overlay comprises a difference between a vector position of points on the one or more die and a vector position of corresponding points on the product substrate.

In another embodiment of the present invention, a method for assembling die onto a product substrate comprises selectively picking one or more die from a source wafer by a vacuum superstrate attached to the one or more die. The method further comprises placing the selectively picked one or more die onto the product substrate with sub-100 nm placement precision, where the sub-100 nm placement precision is enabled by a fluid deployed between the one or more die and the product substrate. The method additionally comprises securely attaching the selectively picked one or more die onto the product substrate using direct bonding by holding onto the one or more die using the vacuum superstrate until the attachment occurs.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which:

FIGS. 3A-3B illustrate a cross-section of a Layer-k Silicon-On-Insulator (SOI) wafer with two buried layers in accordance with an embodiment of the present invention;

FIGS. 4A-4B illustrate another cross-section of a Layer-k SOI wafer in accordance with an embodiment of the present invention;

FIGS. 5A-5B illustrates a further cross-section of a Layer-k SOI wafer in accordance with an embodiment of the present invention;

FIGS. 9A-9E depict the cross-sectional views for flipping and bulk-material removal using the steps described in FIG. 8 in accordance with an embodiment of the present invention;

FIGS. 12A-12B illustrate the overlay and distortion control of a single picked 2D-die in accordance with an embodiment of the present invention;

DETAILED DESCRIPTION

As stated in the Background section, two-dimensional (2D) scaling and general top down fabrication have significant challenges in continuing at and beyond the 7 nm node.

Embodiments of the present invention address such challenges by scaling in the third (3$^{rd}$) dimension as discussed below.

In one embodiment, the present invention uses source wafers with device layers that were fabricated using standard 2D semiconductor fabrication processes (discussed below in connection with FIG. 1) as well as uses the pick-and-place strategies to stack them (source wafers) in a sequential or parallel fashion. Such pick-and-place strategies are discussed in Sreenivasan et al. (WO 2018/119451 A1) (hereinafter referred to as "Sreenivasan et al."), which is hereby incorporated by reference in its entirety. In one embodiment, stacking occurs in a face-to-face (F2F), face-to-back (F2B), back-to-face (B2F) or back-to-back (B2B) fashion. B2F, F2B and B2B can be connected, for example, using Through Silicon Vias (TSVs). F2F can be connected using Inter Layer Vias (ILVs).

A discussion regarding standard semiconductor processes is now deemed appropriate.

A "Layer-0 source wafer," as used herein, refers to a fully populated wafer consisting of transistors and interconnects fabricated using standard 2D fabrication processes. This layer also includes relevant alignment marks and forms the starting layer for the final wafer-scale three-dimensional (3D)-integrated circuit (IC) stack.

A "Layer-k source wafer," as used herein, refers to a fully populated wafer consisting of transistors and interconnects fabricated using standard 2D fabrication processes on a wafer that includes at least one sacrificial layer, such as a buried oxide underneath silicon. This layer also includes relevant alignment marks and is assembled onto layer "k–1" and is part of a 3D-IC stack. The assembly of this layer may be in one step (all 2D die are picked up at once) or in multiple steps where a single 2D-die-array or multiple 2D-die-arrays are picked up from layer "k" wafer and precisely placed onto the layer "k–1" wafer.

In one embodiment, the assembly is performed to achieve sub-50 nm, sub-30 nm, sub-20 nm, sub-10 nm or even sub-5 nm overlay between each 2D-die of the Layer-(k) wafer and the corresponding 2D-die of the Layer-(k–1) wafer.

Figure 1:
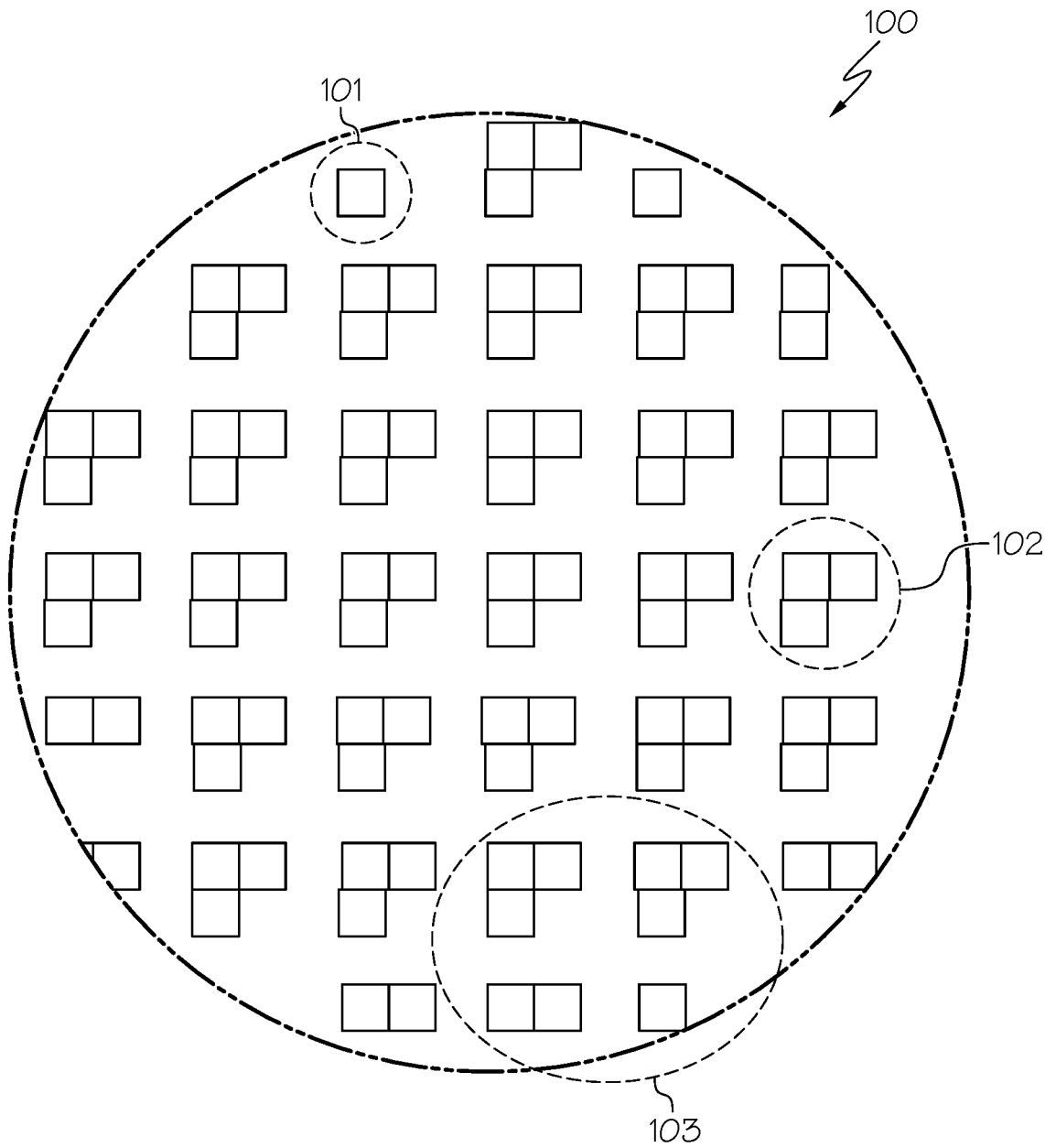
FIG. 1 illustrates an exemplary Layer-k source wafer showing various 2D-die arrangements in accordance with an embodiment of the present invention.

Referring to FIG. 1, FIG. 1 illustrates an exemplary Layer-k source wafer 100 showing various 2D-die arrangements in accordance with an embodiment of the present invention.

Referring to FIG. 1, Layer-k source wafer 100 includes a 2D-die array 101 which is a single 2D-die, a 2D-die array 102 which is a contiguous island of 2D-dies and a 2D-die array 103 which is a group of islands.

A "2D-die," as used herein, refers to a single layer of a three-dimensional (3D)-System on a Chip (SoC), where the 3D-SoC includes at least two 2D-die stacked precisely in a three-dimensional arrangement. These 2D-dies are fabricated using standard 2D semiconductor fabrication processes. In one embodiment, the thickness of the 2D-dies may be less than 10 micrometers. Wafers thinned using standard wafer-thinning processes, such as back-grinding, are projected to remain above 15 μm thickness because of defects induced due to the grinding processes. 2D-dies fabricated using a non-grinding-process, however, can be fabricated with thicknesses that are significantly smaller than current thickness limits.

"A 2D-die array," as used herein, refers to a single 2D-die (see 2D-die array 101) or a group of 2D-die that are collectively moved from their source wafer (e.g., Layer-k) and assembled collectively and precisely onto the previous wafer (Layer-(k–1)), where k>1. This 2D-die-array can include a single island of 2D die that form a contiguous group (see 2D-die array 102). Alternatively, the 2D-die-array can include multiple islands of 2D die, where each island of 2D die forms a contiguous group but the islands are not contiguous (see 2D-die array 103).

"Overlay," as used herein, refers to a vector quantity defined at every point on the wafer. It is the difference between the vector position of points on a substrate geometry and the vector position of the corresponding point in an overlaying pattern. A generally accepted quantifier of overlay is the (Mean+3*Sigma) value of said overlay vector magnitudes.

"Alignment," as used herein, refers to the set of rigid body errors (translation and rotation) between two overlaying bodies.

Figure 2:
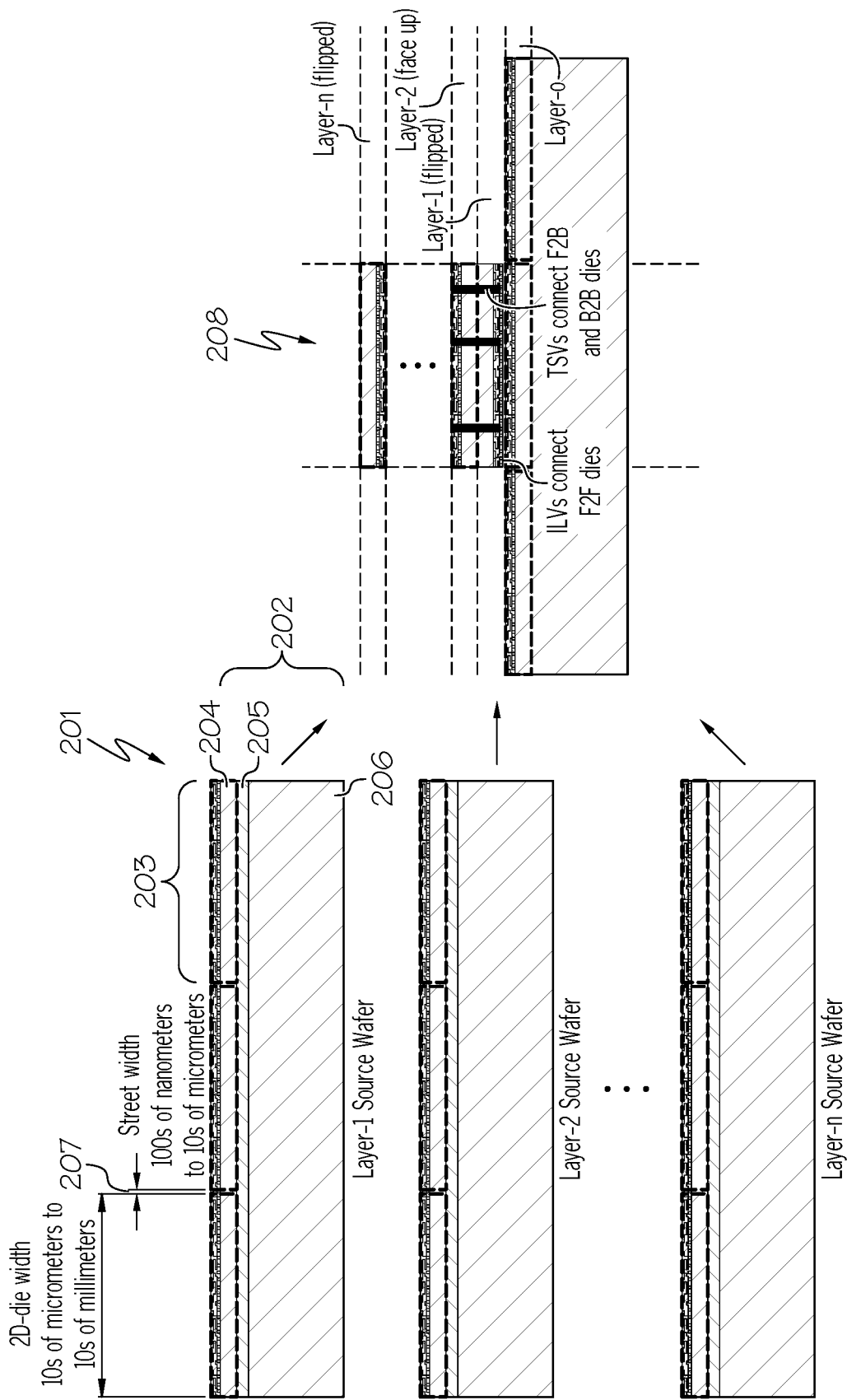
FIG. 2 illustrates stacking of Layer-k 2D-die arrays (k>1) onto a Layer-1 2D-die array in accordance with an embodiment of the present invention.

Referring to FIG. 2, FIG. 2 illustrates stacking of Layer-k 2D-die arrays (k>1) onto a Layer-1 2D-die array in accordance with an embodiment of the present invention.

As shown in FIG. 2, in one embodiment, Layer-1 of the source wafer 201 corresponds to a silicon-on-insulator wafer 202 with three elements 203. In one embodiment, wafer 202 includes a layered silicon 204-insulator (sacrificial layer) 205-silicon 206 substrate. In one embodiment, element 203 is a "feedstock," which in its most general form, consists of layers of transistors, interconnects and dielectrics. Furthermore, in one embodiment, element 203, as used herein, may include silicon layer 204 of SOI wafer 202. It may or may not have any functionality in itself, but when assembled together with other elements 203 and possibly additional interconnect and dielectric layers, it could be used to fabricate a working ASIC. Additionally, front-end high-resolution device layers, for which mask cost is high, would reside inside element 203. This is to amortize the cost of expensive masks (for the high-resolution device layers) across the fabrication of a variety of ASIC devices.

In one embodiment, the width of element 203 corresponds to a 2D-die width of tens of millimeters. In one embodiment, the street width or "scribe width" may range from hundreds of nanometers to tens of micrometers. In one embodiment, such a width corresponds to the boundaries 207 of element 203.

Each of the layers of the source wafer shown in FIG. 2, such as Layer-2 . . . Layer-n, where n is a positive integer number, are configured similarly as Layer-1 201. As a result, each of these Layers (referred to as simply "Layer-k," where k is a positive integer number) may generally be referred to herein as element 201.

As shown in FIG. 2, the layers of the source wafer are stacked in an interweaving fashion (flipped, face up, flipped, face up . . . ) forming a 3D-IC stack 208, which will be discussed in greater detail below.

Furthermore, FIG. 2 illustrates that B2F, F2B and B2B can be connected, for example, using Through Silicon Vias (TSVs), and that F2F can be connected using Inter Layer Vias (ILVs). A further description regarding such features, including the Layer-k wafer, is provided below.

In one embodiment, fluid is deployed allowing lubricated relative motion between the Layer-(k) two-dimensional (2D)-die array (e.g., 2D-die array 102) and the Layer-(k–1) 2D-die array (e.g., 2D-die array 102), where the fluid allows precision overlay of the Layer-(k) and Layer-(k–1) 2D-die arrays. In one embodiment, the fluid is a gas, a liquid or a combination thereof. In one embodiment, such a combination includes disparate gas and liquid portions or portions of homogenously mixed gas and liquid.

In one embodiment, the first layer 2D-die arrays can be on any arbitrary substrate, but subsequent 2D-die arrays (which may be picked-and-placed) need an underlying sacrificial layer as shown in FIGS. 3A-3B. As a result, in one embodiment, Layer-k 2D-die may need an underlying oxide layer for optimal device functioning (for instance, Fully Depleted (FD)-SOI and Partially Depleted (PD)-SOI). This would necessitate another sacrificial layer at a deeper level for pick-and-place. In one embodiment, these are commercially available through Lapis Semiconductor®.

In one embodiment, the 2D-die width may range from tens of micrometers to tens of millimeters.

Referring now to FIGS. 3A-3B, FIGS. 3A-3B illustrate a cross-section of a Layer-k SOI wafer with two buried layers (insulator and sacrificial layers, which can be comprised of the same material, for instance silicon oxide) in accordance with an embodiment of the present invention.

As shown in FIG. 3B, the cross-section of a Layer-k SOI wafer 201 illustrates that element 203 may consist of transistors 301, interconnects 302 and dielectrics 303. In one embodiment, element 203 further includes a layer of silicon 304. Furthermore, as discussed above, Layer-k 2D die may need an underlying oxide layer 305 for optimal device performance.

In one embodiment, as shown in FIG. 3A, the 2D-die thickness may range from tens of nanometers to tens of micrometers.

Furthermore, in one embodiment, FIG. 3A illustrates the boundaries 207 of elements 203.

Alternatively, in one embodiment, Layer-k 2D-die may not need an underlying oxide as shown in FIGS. 4A-4B. FIGS. 4A-4B illustrate another cross-section of a Layer-k SOI wafer in accordance with an embodiment of the present invention.

In such an embodiment, a sacrificial layer may need to reside at a deeper level than found in standard PD-SOI wafers for mechanical stability purposes. These are commercially available through multiple sources, for instance, ShinEtsu®.

Furthermore, in one embodiment, the sacrificial oxide (for pick-and-place) is at the same depth as used for standard PD-SOI wafers as shown in FIGS. 5A-5B. These are available commercially through multiple sources, for instance, Soitec®.

FIGS. 5A-5B illustrates a further cross-section of a Layer-k SOI wafer in accordance with an embodiment of the present invention.

As shown in FIGS. 5A-5B, in one embodiment, the 2D-die thickness is approximately 100 nanometers or lower.

A discussion regarding the process and mechanical design concepts for 3D-integrated circuits (ICs) is now deemed appropriate.

In one embodiment, the general applicable assembly sequence is substantially the same as described in Sreenivasan et al. (WO 2018/119451 A1) (hereinafter referred to as "Sreenivasan et al."), which is hereby incorporated by reference in its entirety. For example, the steps are as follows: 1. Etch and encapsulation; 2. Bulk-etch processes (to facilitate subsequent pick-and-place); 3. 2D-die array pickup; 4. Alignment of 2D-die array(s) to product substrate; 5. Temporary attachment and bonding; and 6. Repeat 3-5 until product wafer is fully assembled.

In one embodiment, the assembly sequence for a 3D-IC may require some modifications to steps 2, 4 and 5 as discussed below.

The bulk etch-processes to facilitate subsequent pick-and-place need some modification to account for the type of stacking being done (F2F vs F2B vs B2F vs B2B). With respect to B2F and B2B type stacking, the bulk-etch processes described in Sreenivasan et al. would suffice since the Layer-k wafer does not need to be flipped. However, for F2F and F2B type stacking approaches, in addition to bulk-etch, a wafer flipping step needs to happen. Additionally, for F2F type stacking, a stripping step is needed to selectively remove the encapsulation layer for face-to-face connectivity. This could be done in various ways, depending on the specific nature of encapsulation layers used—for instance, if the encapsulation layer is composed of $Al_2O_3$, then a timed buffered oxide etch might be used. Alternatively, if the encapsulation layer is composed of chemical vapor deposited (CVD) amorphous carbon, an oxygen plasma could be used for the stripping. Alternatively, if the encapsulation layer is composed of multiple layers, for instance $Al_2O_3$ on top of CVD amorphous carbon, then the oxygen plasma step and buffered oxide etch could be done in sequence. In one embodiment, the encapsulation layer protects the 2D-dies in both the Layer-(k) wafer and the Layer-(k−1) wafer from etchants used during a pick-and-place process. In one embodiment, the encapsulation layer is compatible with existing semiconductor fabrication technologies, such as complementary metal-oxide-semiconductor (CMOS) and III-V semiconductors (e.g., gallium nitride, gallium arsenide). Two different techniques for flipping and bulk-material removal are discussed below in connection with FIGS. 6, 7A-7D, 8 and 9A-9D.

Figure 6:
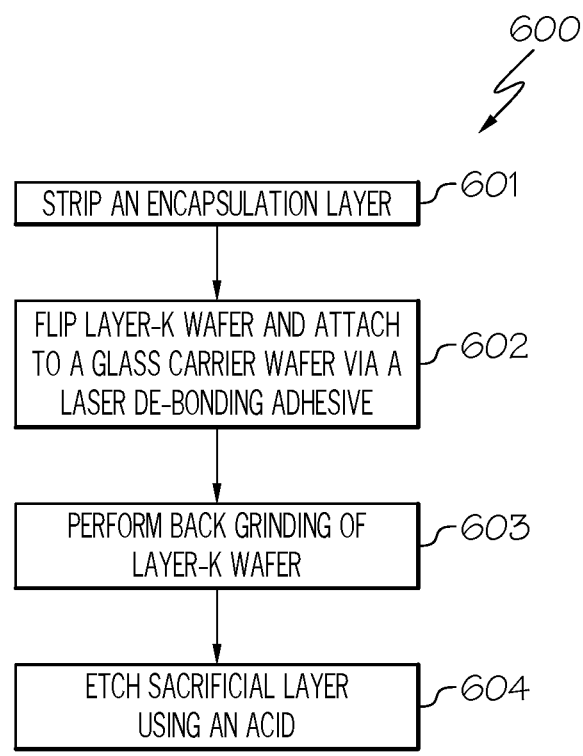
FIG. 6 is a flowchart of a method for the back-grinding based approach for flipping and bulk-material removal in accordance with an embodiment of the present invention.

FIG. 6 is a flowchart of a method for the back-grinding based approach for flipping and bulk-material removal in accordance with an embodiment of the present invention. FIGS. 7A-7D depict the cross-sectional views for flipping and bulk-material removal using the steps described in FIG. 6 in accordance with an embodiment of the present invention.

Figure 7A:
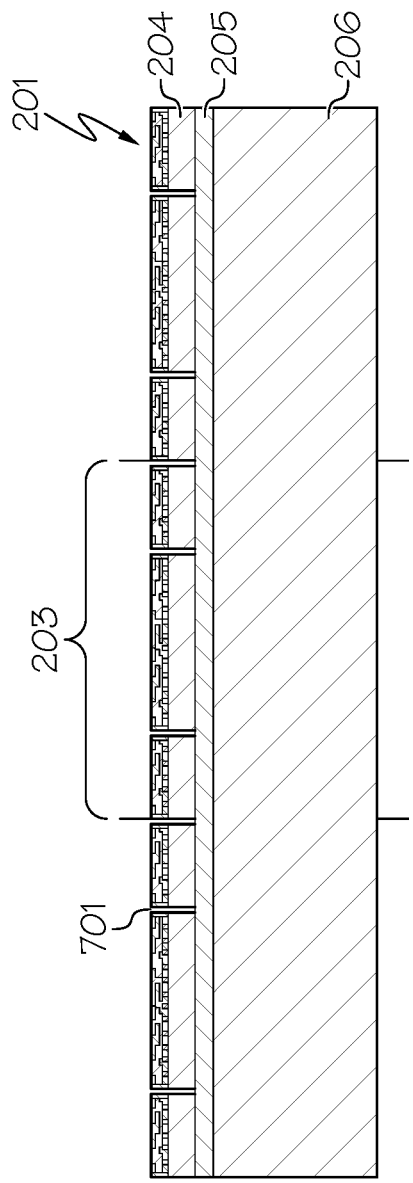
FIGS. 7A-7D depict the cross-sectional views for flipping and bulk-material removal using the steps described in FIG. 6 in accordance with an embodiment of the present invention.

Referring now to FIG. 6, in conjunction with FIGS. 7A-7D, in step 601, an encapsulation layer (not shown) is stripped as shown in FIG. 7A. Furthermore as illustrated in FIG. 7A, access holes 701 may be used to speed up the etching process. In one embodiment, access holes 701 are used for etchants, such as hydrofluoric acid, to release the 2D-die from the wafer. In one embodiment, access holes 701 are utilized to create conductors that enable Through Silicon Vias (TSVs).

Figure 7B:
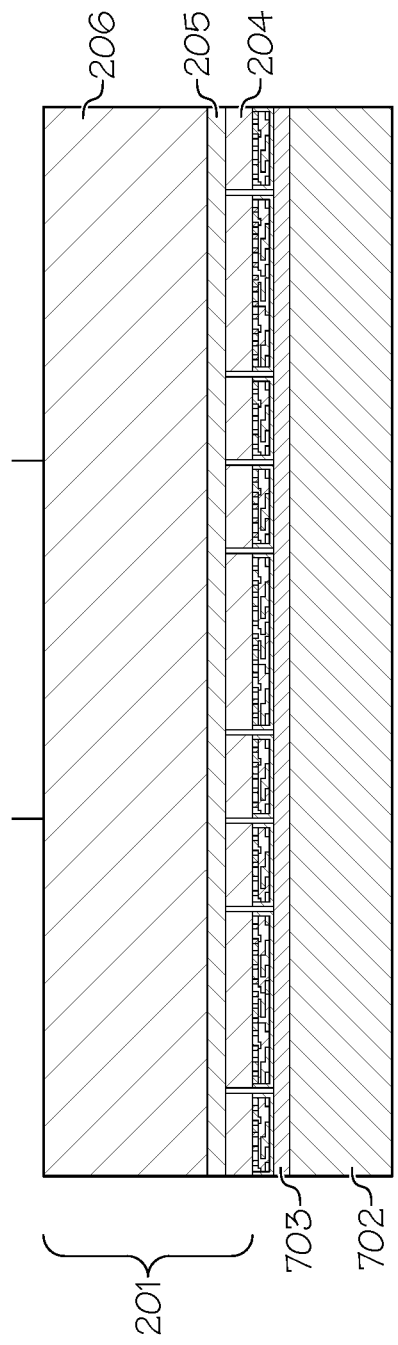

In step 602, Layer-k wafer 201 is flipped and attached to a glass carrier wafer 702 via a laser de-bonding adhesive 703 (commercially available) as shown in FIG. 7B.

Figure 7C:
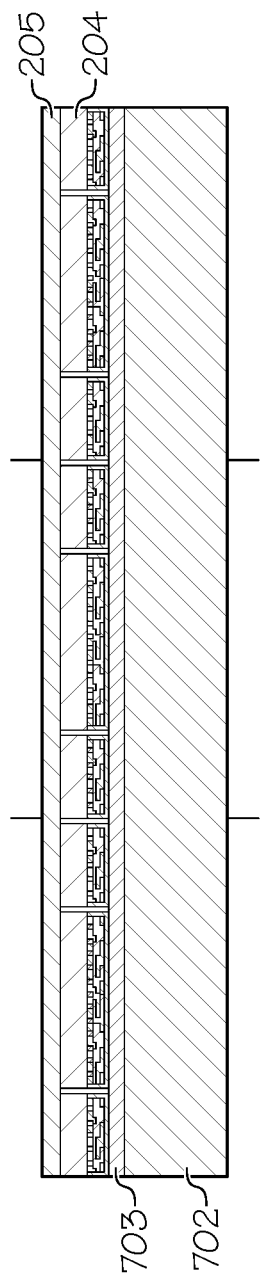
Figure 7D:
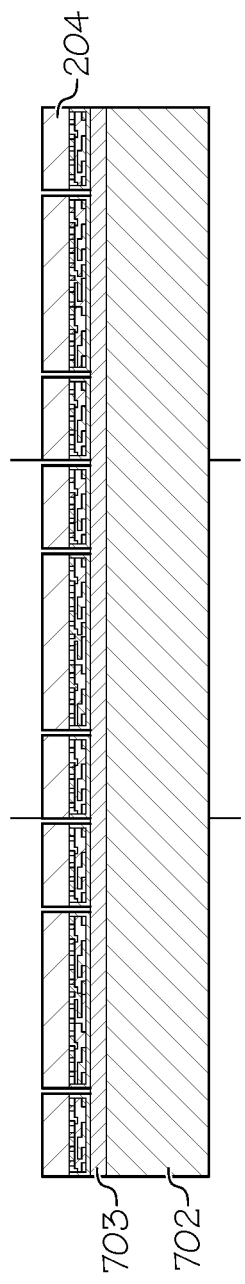

In step 603, back grinding of Layer-k wafer 201 is performed as shown in FIG. 7C.

In step 604, sacrificial layer 205 is etched using an acid, such as hydrofluoric acid (HF).

Figure 8:
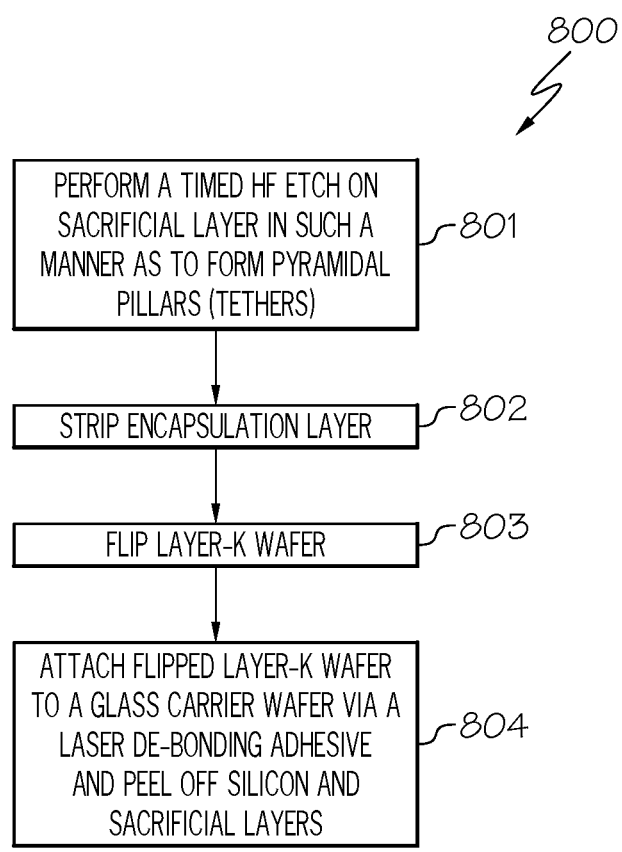
FIG. 8 is a flowchart of a method for the peel-off based approach for flipping and bulk-material removal in accordance with an embodiment of the present invention.

FIG. 8 is a flowchart of a method for the peel-off based approach for flipping and bulk-material removal in accordance with an embodiment of the present invention. FIGS. 9A-9E depict the cross-sectional views for flipping and bulk-material removal using the steps described in FIG. 8 in accordance with an embodiment of the present invention.

Figure 9A:
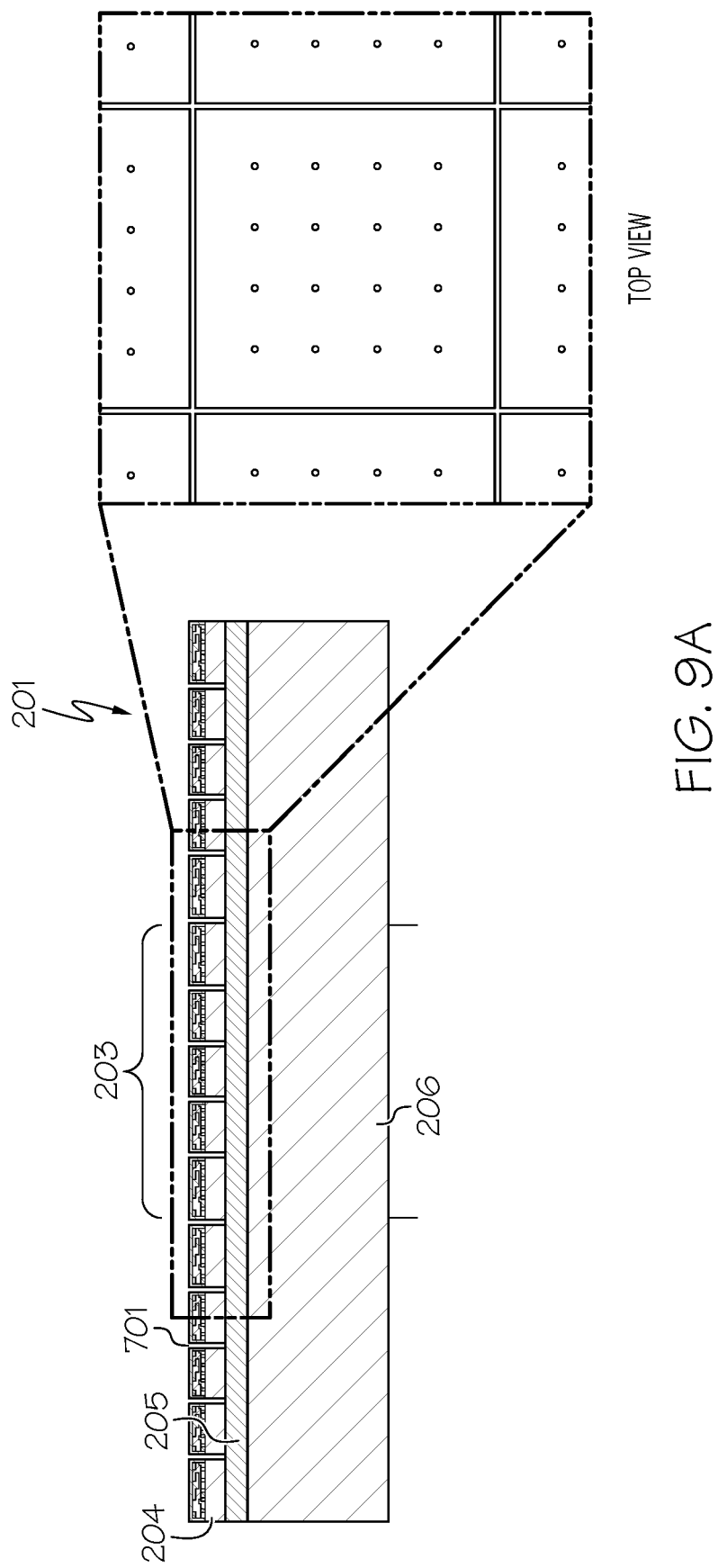
Figure 9B:
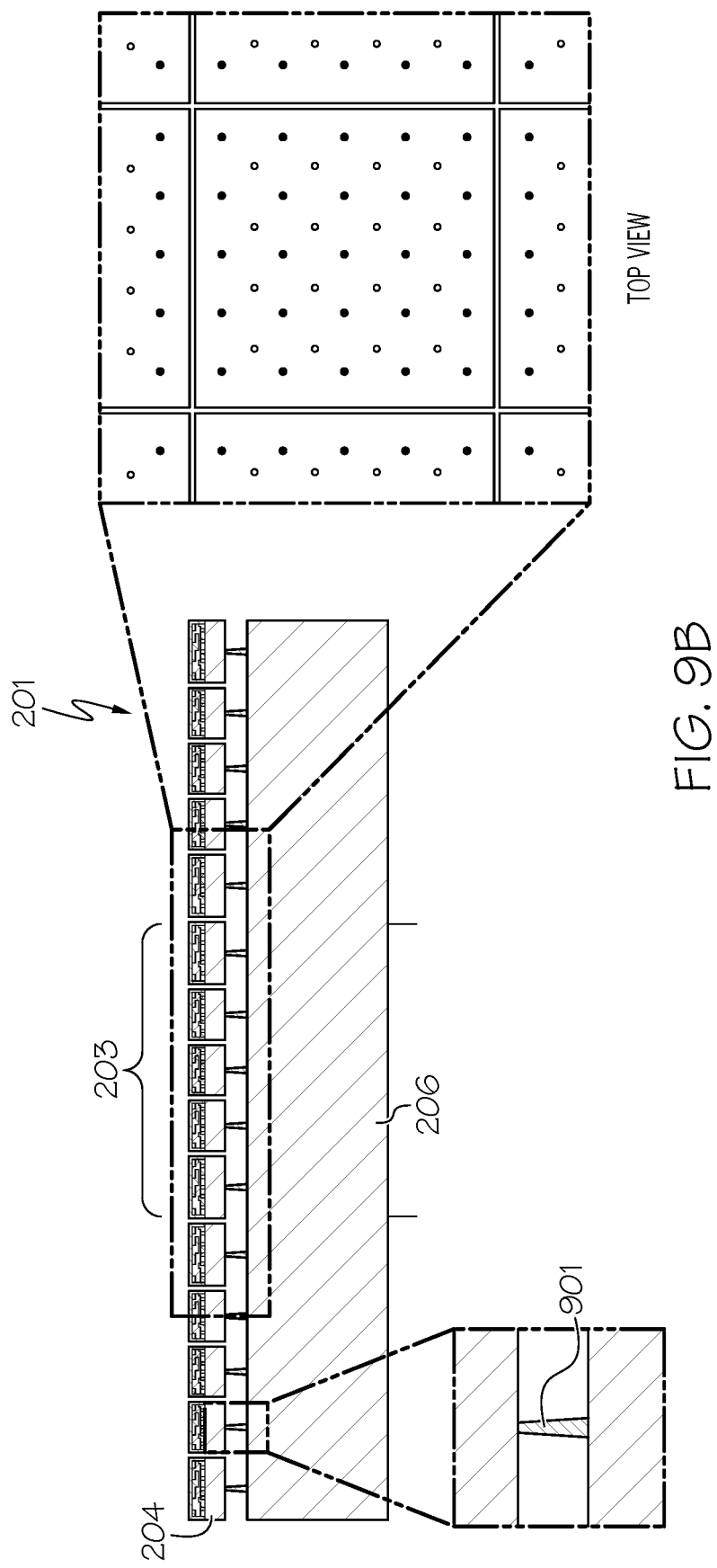

Referring now to FIG. 8, in conjunction with FIGS. 9A-9D, in step 801, a timed HF etch is performed on sacrificial layer 205 in such a manner as to form pyramidal pillars (tethers) 901 as shown in FIGS. 9A and 9B. These pyramidal tethers 901, as will be discussed later, can facilitate the pick-and-place step. Furthermore, as shown in FIG. 9A, access holes 701 may be used to speed up the etching process.

In step 802, the encapsulation layer (not shown) is stripped as shown in FIG. 9C.

In step 803, Layer-k wafer 201 is flipped as shown in FIG. 9D.

Figure 9E:
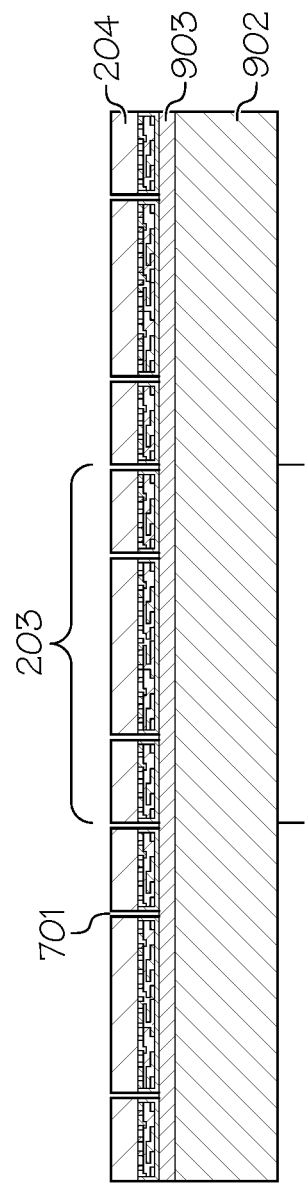

In step 804, the flipped Layer-k wafer 201 is attached to a glass carrier wafer 902 via a laser de-bonding adhesive 903 (commercially available) and silicon and sacrificial layers 206, 205 are peeled off as shown in FIG. 9E.

The principles of the present invention also align and provide distortion control of picked 2D-die arrays to the product substrate as discussed below.

In one embodiment, precision alignment can be achieved based on whether single or multiple 2D-dies are being assembled simultaneously, which is distinct from the methods discussed in Sreenivasan et al.

In the case of multiple 2D-dies, the moiré metrology needs to refer to the superstrate and not the individual 2D-dies being picked-and-placed. This would necessitate alignment marks to be patterned on the bottom surface of the superstrate. These marks could be patterned on the absolute corners of the superstrate or could also be distributed areally. Corresponding marks would be needed on the product wafer. Some amount of distortion control of the 2D-dies could be implemented using thermal actuation. Additionally, thermal actuation could be implemented in the wafer chuck as well for added actuation degrees-of-freedom. Observation widows could be made in the superstrate in case the superstrate material is not transparent to the wavelength of light used for metrology (which is generally visible or IR). Alternatively, the superstrate could be constructed out of transparent materials, such as SiC and/or sapphire ($Al_2O_3$), which are commercially available. A discussion of precision alignment involving multiple 2D-dies is discussed below in connection with FIGS. 10 and 11A-11B.

Figure 10:
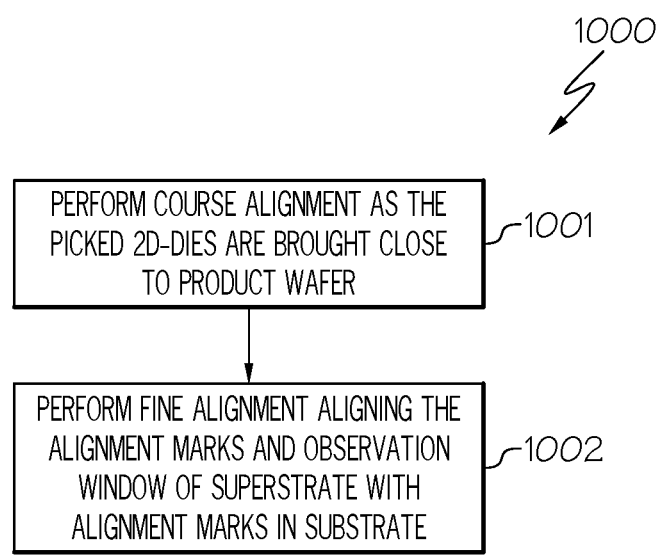
FIG. 10 is a flowchart of a method for overlay and distortion control of multiple packed 2D-dies in accordance with an embodiment of the present invention.
Figure 11A:
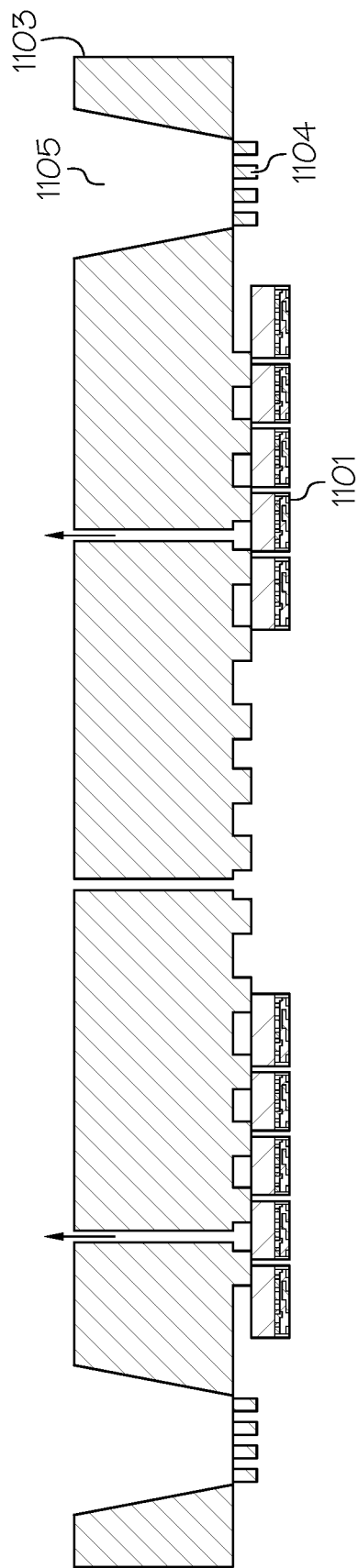
FIGS. 11A-11B depict the cross-sectional views for providing overlay and distortion control of multiple packed 2D-dies using the steps described in FIG. 10 in accordance with an embodiment of the present invention.
Figure 11B:
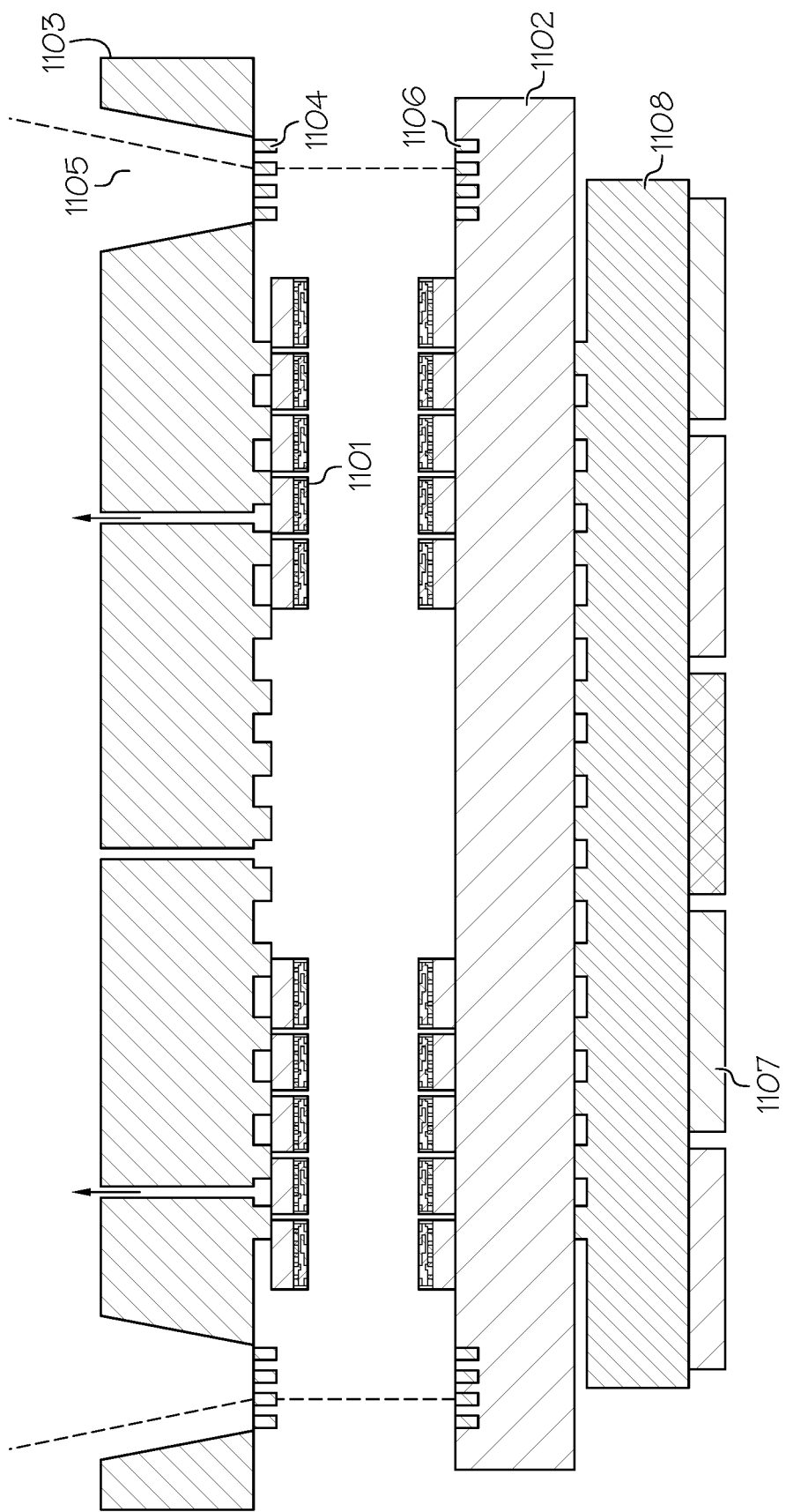

FIG. 10 is a flowchart of a method 1000 for overlay and distortion control of multiple packed 2D-dies in accordance with an embodiment of the present invention. FIGS. 11A-11B depict the cross-sectional views for providing overlay and distortion control of multiple packed 2D-dies using the steps described in FIG. 10 in accordance with an embodiment of the present invention.

Referring to FIG. 10, in conjunction with FIGS. 11A-11B, in step 1001, as the picked 2D-dies 1101 (picked 2D-dies, such as 2D-die arrays 101, 102, 103) are brought close to product wafer 1102, course alignment is first done as shown in FIG. 11A. FIG. 11A illustrates superstrate 1103 with alignment marks 1104 and observation windows 1105.

In step 1002, fine alignment is performed aligning the alignment marks 1104 and observation window 1105 of superstrate 1103 with the alignment marks 1106 in the substrate. In one embodiment, some amount of distortion control of the 2D-dies could be implemented using thermal actuation via thermal actuators 1107. Additionally, thermal actuation could be implemented in the wafer chuck 1108 as well as for added actuation degrees-of-freedom.

Figure 12B:
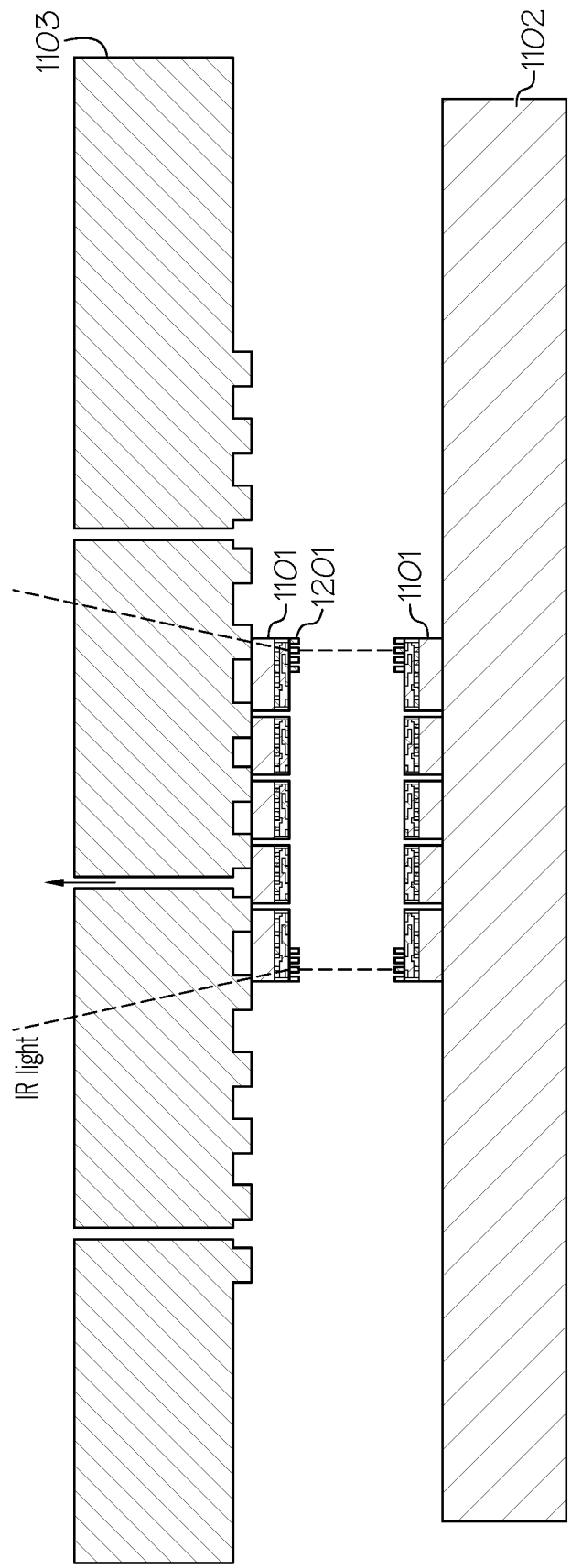

In the case of single 2D-dies, in addition to the method described above, moiré metrology could be conducted using IR-sensitive marks 1201 embedded in the Layer-k and Layer-(k−1) 2D-dies 1101 and an IR-transparent superstrate as shown in FIGS. 12A-12B. FIGS. 12A-12B illustrate the overlay and distortion control of a single picked 2D-die in accordance with an embodiment of the present invention.

Figure 13:
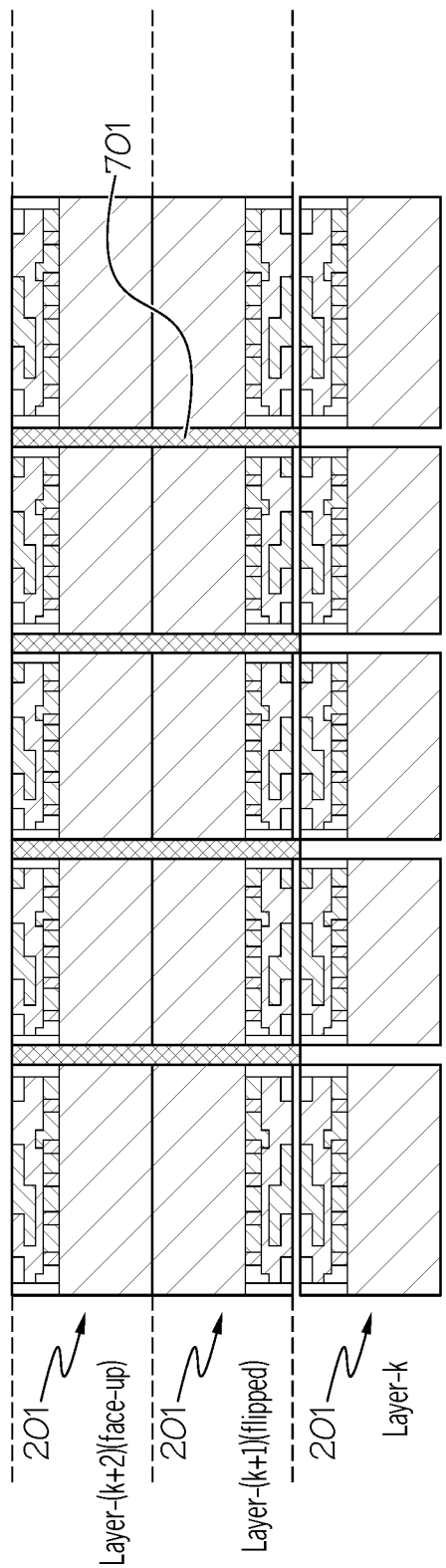
FIG. 13 illustrates that Through Silicon Vias (TSVs) are made through the access holes already present in picked-and-placed 2D-dies in accordance with an embodiment of the present invention.

Referring now to FIG. 13, FIG. 13 illustrates that Through Silicon Vias (TSVs) are made through the access holes already present in picked-and-placed 2D-dies in accordance with an embodiment of the present invention. As shown in FIG. 13, Layer-k, Layer-(k+1) and Layer-(k+2) are arranged in a manner where Layer-(k+1) is flipped and Layer-(k+2) is faced-up. As further shown in FIG. 13, Through Silicon Vias are fabricated through field access holes 701.

The density of TSVs that are needed can be as much as 10,000/mm for applications, such as static random-access memory (SRAM) stacking. At this level of TSV density, the diameter of the TSV can be approximately 20 nm to 80 nm. Some or all of these TSVs could potentially be routed through the access holes 701 that already exist in 2D-dies.

Figure 14A:
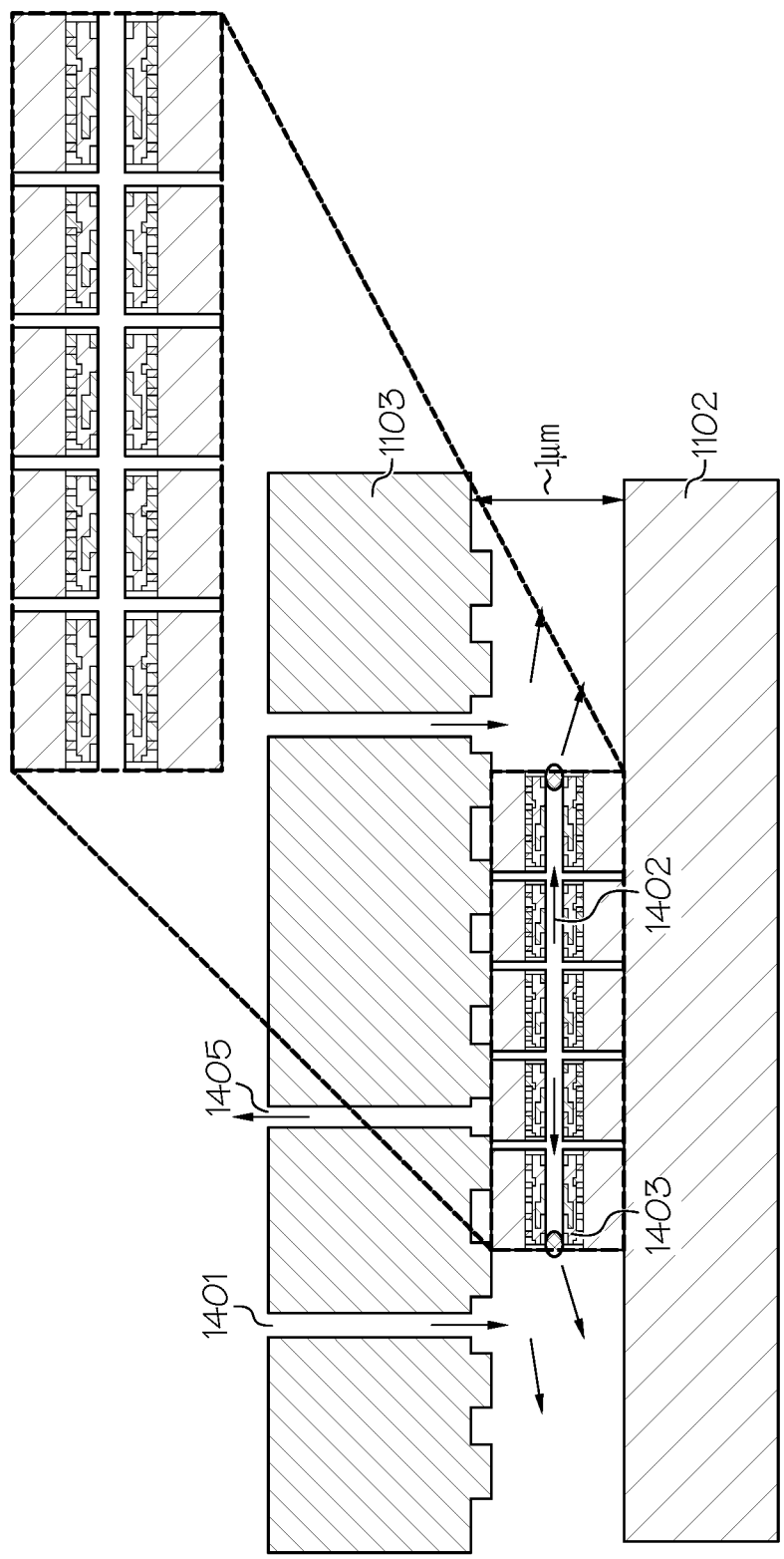
FIGS. 14A-14C illustrate an exemplary process for temporary attachment and bonding in accordance with an embodiment of the present invention.
Figure 14B:
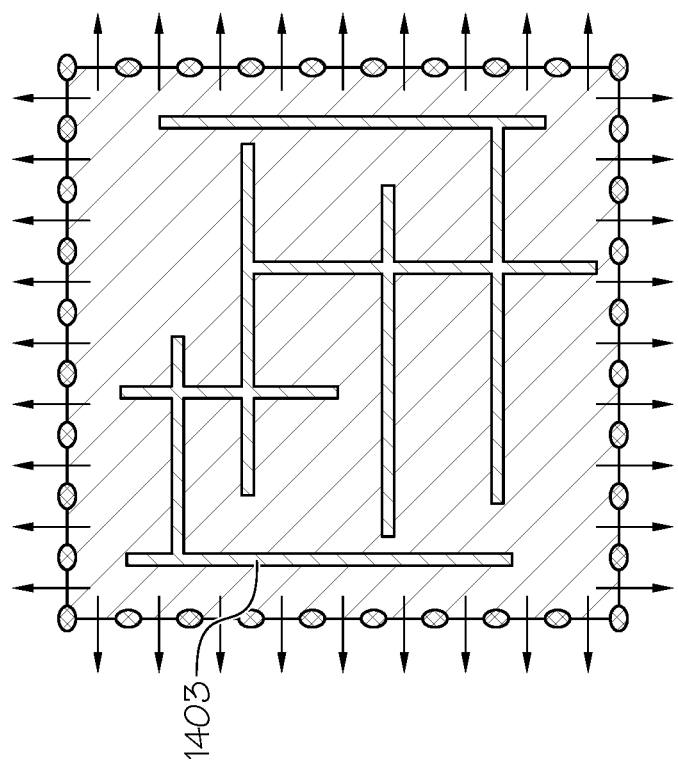
Figure 14C:
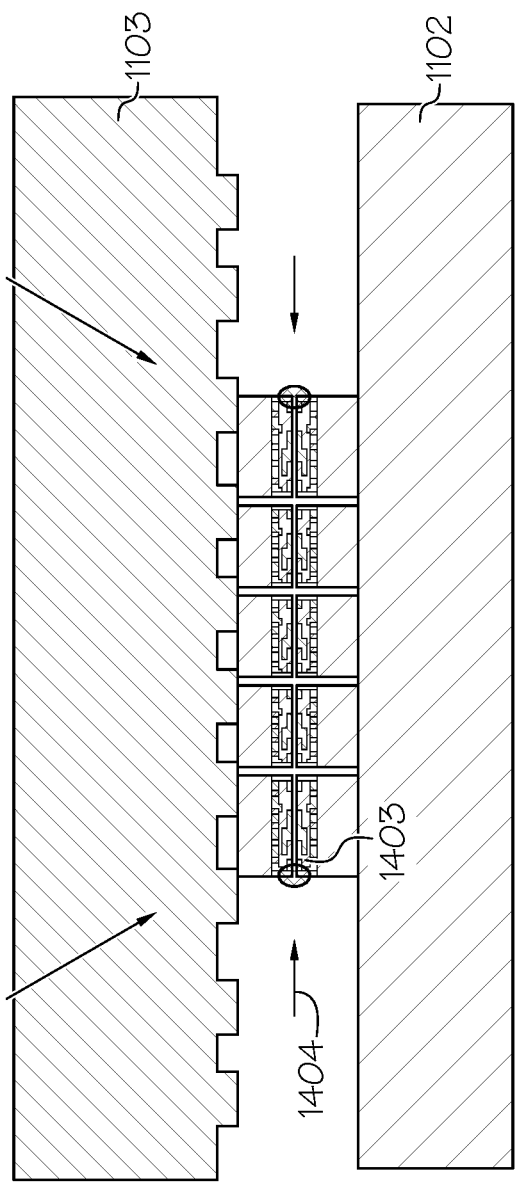

Referring now to FIGS. 14A-14C, FIGS. 14A-14C illustrate an exemplary process for temporary attachment and bonding in accordance with an embodiment of the present invention.

In one embodiment, temporary attachment may be followed by bonding. In one embodiment, a dynamic air-cushion based "slow landing" approach could be used. Such systems have previously been used in high-precision air-bearing stages, in hard-disk drive systems, and have been studied for drop skating on solid surfaces. In this approach, a thin layer of UV-curable adhesive could first be dispensed on the edge of the layer-0 2D-die. Said adhesive could be composed of a combination of volatile and non-volatile components, where in the limiting case the adhesive is composed of solely non-volatile components. The liquid comprised of UV-curable adhesive and/or volatile component provides damping thereby substantially minimizing vibrational displacement between the Layer-0 and Layer-1 2D-die. As the superstrate, with attached Layer-1 2D-die is brought in proximity to the Layer-0 die, air-flow through the pressure holes 1401 could be initiated. This would create a bearing composed of air or nitrogen (to obtain an inert environment) around the periphery of the 2D-die. The combined knobs of superstrate z-force and the said above bearing flow rate could be used to control the "soft landing." Simultaneously, coarse alignment corrections could be done as the superstrate 1103 is being urged down. Simultaneously, a second air cushion 1402 is created in between the 2D-dies being stacked. This second air cushion 1402 could provide additional lubrication between 2D-dies during fine-alignment corrections.

Additionally, the outward flow of air from this air cushion would ensure that volatile components in the adhesive (which is on the edge) do not contaminate metal-metal contacts 1403 in the bulk of the 2D-die. Additionally, the flow rate of the second air cushion 1402 could be controlled by varying the topography of the 2D-dies using a superstrate 1103 with z-direction piezoelectric actuators. Such systems have been demonstrated previously. Once the 2D-dies make contact, a blanket UV exposure 1404 could be done to cure the edge placed adhesive. To further secure the 2D-dies, a surface activation of the metal contacts 1403 could be done. Such a process has been shown before for room temperature metal to metal bonding including metals, such as copper, tungsten and aluminum. Surface activation of copper can be achieved using argon ion treatment of the copper surface. In one embodiment, it is assumed that all of the air used in the above air bearings are semiconductor grade clean dry air. Alternatively, if the bearing uses nitrogen, it is also assumed to be semiconductor grade, clean and dry. In one embodiment, the surface activated copper is maintained in an inert environment after the activation process till the bonding step (including transport from tool-tool and in every tool, it is processed in). In one embodiment, vacuum holes 1405 may be used to enable a vacuum based pickup mechanism.

A discussion regarding the design and electronic design automation (EDA)/computer-aided design (CAD) flows required to implement the 3D-IC System on Chip (SoC) is now deemed appropriate. Typically, 2D ASIC SoC comprises of billions of transistors which are placed optimally to meet the performance/speed, area and power specifications.

In order to efficiently design 2D ASIC SoC, i.e., meeting design specifications with lower turn-around time (TAT) to market, there exists commercial EDA CAD tools to simplify the design process. However, no such EDA tools exist for 3D-IC ASIC design.

A typical ASIC SoC can be broadly divided into the following segments: logic (CPU, GPU, Modem, etc.), memory/cache (static random access memory (SRAM), embedded dynamic random access memory (eDRAM), etc.), third-party IP blocks, analog IP, IO, etc. 3D SoC design aims to implement same functionality SoC while reducing the foot print and improving its performance in terms of reduced memory access times and latency, higher bandwidth, higher capacity in terms of Mbits/mm$^2$, higher frequency due to shorter interconnect delays, etc.

A typical 3D SoC, which may also be referred to herein as the "Nano-precision aligned 3D Stacked Integrated Circuit (N3SI)" includes n base transistor layers, where n>1. In one embodiment, an application specific integrated circuit (ASIC) system on a chip (SoC) with logic and memory circuitry is designed and manufactured in three dimensions using a sub-50 nm overlay pick and place method, which allows precision overlay of the logic and memory circuitry. Each base layer might have m metal layers, where m>=1 and may vary for each base layer. The base layers in the 3D stack can be placed in any of the following configurations with respect to each other: face-to-face, face-to-back, back-to-back, etc. The connections across different base layers can be made using Interlayer Via (ILV) if base layers are in face-to-face configuration or using nanoscale Through Silicon Via (nano-TSV) if it is face-to-back or back-to-back configuration. 3D SoC can be designed using combination of any of the following design approaches: 2D logic implementation with 3D memory implementation, 3D logic implementation with 2D memory implementation, 3D logic implementation with 3D memory implementation, etc. The 3D logic implementation can be either performed at the block/partition level or can be performed at the flat level. In the 3D block level logic implementation, partitions are synthesized and routed using 2D tools, but different partitions are placed in different base layers. This approach requires changes only in the top level SoC design, whereas, the block level design of the 3D SoC remains the same as the 2D SoC. Thus, this approach is easier to implement. In the flat level 3D logic implementation, the partitions are also implemented in 3D, i.e., cells within a partition are placed in multiple base layers. 3D logic implementation and 3D memory design implementation are discussed below, respectively. The area overhead due to TSVs and HF holes can be also optimized by space optimization algorithms.

Figure 15:
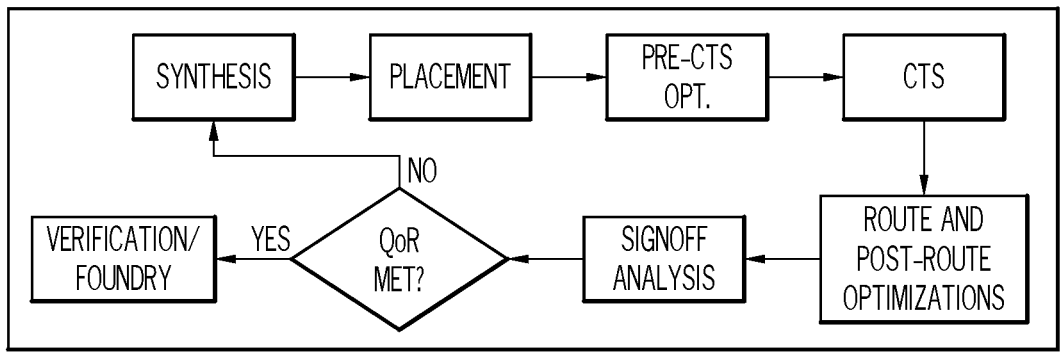
FIG. 15 illustrates the conventional 2D Application-Specific Integrated Circuit (ASIC) Electronic Design Automation (EDA) flow for logic implementation in accordance with an embodiment of the present invention.

Electronic Design Automation (EDA) design methodology for 3D-IC logic implementation is now discussed. The conventional 2D ASIC EDA flow for logic implementation is shown in FIG. 15 in accordance with an embodiment of the present invention. Synthesis is performed in the front-end design phase, whereas, the backend design phase performs placement, pre-CTS optimization, clock tree synthesis (CTS), route, post route optimizations, signoff analysis and design verification.

The EDA methodology of the present invention for 3D-IC SoC is also similar to the 2D ASIC flow. The methodology attempts to re-use most of the existing commercial 2D EDA tools along with using some of the solutions developed in-house. Such a flow is referred to herein as the "N3SI EDA flow." The following sub-sections describe the N3SI EDA flow design steps.

Synthesis for 3D-IC SoC

The synthesis of 3D-IC SoC makes use of the commercial 2D synthesis tool. In the first pass, the design is synthesized exactly as it is done in 2D SoC. Once the placement is performed, 3D placement aware synthesis is performed. In this synthesis pass, the tool synthesizes the cells more optimally since it has 3D placement information to get accurate interconnect loads and delays. This process flow is also similar to 2D placement aware synthesis, however, placement information in this case is three-dimensional.

Placement for 3D-IC SoC

This section deals with the 3D placement of logic/standard cells. In the methodology of the present invention, design netlist is first partitioned into multiple modules such that each module netlist consists of logic cells, etc. to be placed on different layers of a 3D-IC SoC stack. Then, 2D placement for each module in an assigned layer of 3D stack is performed using commercial 2D EDA tools. The netlist partitioning can be performed using in-house solutions which make use of standard partitioning algorithms, such as FM Min-Cut, Min-Flow, etc. The modules generated in partitioning consist of input/output ports which are not placed only on the module periphery, but can be placed anywhere in the module. As a result, the in-house developed software uses standard partitioning algorithms to generate the locations of these ports. Multiple modules transfer signals through these ports. These ports can be connected through Interlayer Via (ILV) or nanoscale Through Silicon Via (nano-TSV). The locations of these ports might be constrained based on thermal and mechanical stability of ILVs and TSVs. Once the port locations are decided, the timing budgets and port locations are fed to the 2D placer tool to perform placement of each module independently while making sure that overall timing and performance metrics are met. In order to ensure legal cell placement, placement or routing blockages are formed in the module regions from where TSV or HF holes pass. That is, the in-house developed software uses standard partitioning algorithms to generate placement or routing blockages, such as to avoid (Design Rule Checking) DRC issues at ILV/TSV locations.

CTS for 3D-IC SoC

The clock tree synthesis (CTS) for 3D SoC can be performed using existing 2D EDA placement and route (P&R) tools. Once the design is partitioned and placed into multiple modules, clock tree can be built and optimized for each module separately. However, the challenge with 3D clock tree is to ensure that there is no setup, hold, etc. violations while considering process variations across multiple wafers on which the 3D clock tree might be built. There can be multiple ways to resolve or obviate this problem. One of the possible solutions is to constrain placement of the launch and capture flop on the same layer, i.e., launch and capture flop for data path needs to be placed on the same layer. This can be achieved by the in-house netlist partitioning tool. Another solution is to include the high margin in order to ensure that there are no violations in the worst case process variation scenario.

Route for 3D-IC SoC

The route methodology for the 3D-IC SoC includes 2D routing within each module, and routing across multiple modules using ILV and nano-TSV. The resistance and capacitance values can be determined accurately, and will be discussed next. The 3D-IC routing methodology remains the same as 2D routing. The routing for each module can be implemented using the 2D P&R tool separately. In order to ensure no design rule check (DRC) failures, routing blockages are formed in regions, where ILV and TSV interconnects are placed.

Parasitic Extraction for 3D-IC SoC

The design methodology for parasitic extraction of 3D SoC differs from 2D ASIC. The resistance and capacitance values can vary significantly due to TSVs and ILVs. The commercial EDA tools are not capable of performing 3D extraction. However, embodiments of the present invention utilize the 3D extraction flow which makes use of the existing 2D extractor. In this flow, the layout information for each module or layer is first streamed out. Then, layout/route data for all the modules is streamed into a layout editor tool, such as Virtuoso®. While streaming in, the layout of any specific module can be flipped if required to make it look identical to the 3D SoC stack. Then, the extractor is run on this layout. The resistance and capacitance values obtained have taken into account the 3D layout, considering TSVs and ILVs, and are expected to be accurate.

Figure 16:
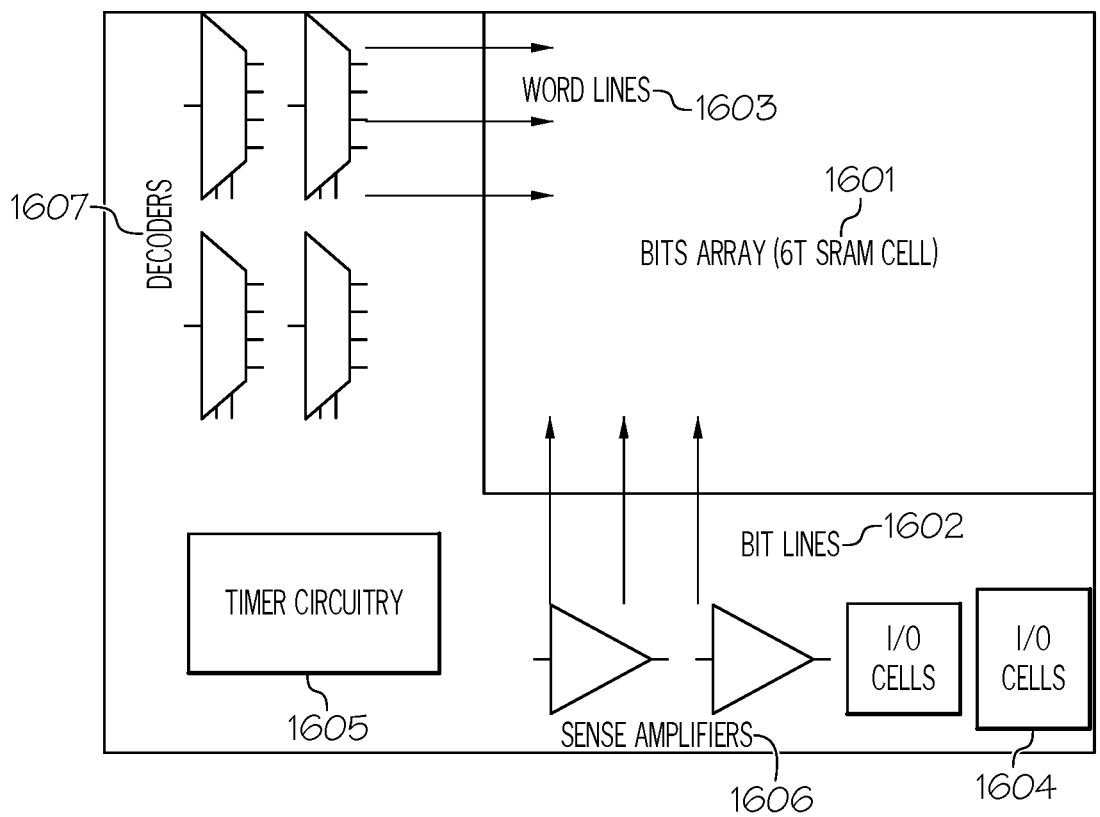
FIG. 16 illustrates the 2D single sided static random access memory (SRAM) configuration in accordance with an embodiment of the present invention.

A 3D design implementation of static random access memory (SRAM) is now discussed. A typical SRAM includes a bit cell array with word and bit lines, sense amplifiers, column and row decoders, timer circuitry, IO, other peripheral circuitry, etc. There are multiple SRAM configurations, such as the butterfly configuration, the single sided configuration, etc. to place SRAM design elements. These configurations differ in implementation complexity, access times, latency, etc. FIG. 16 illustrates the 2D single sided SRAM configuration in accordance with an embodiment of the present invention. The SRAM configuration includes basic memory design elements, such as the bit array of SRAM cells 1601, bit lines 1602, word lines 1603, IO cells 1604, timer circuitry 1605, sense amplifiers 1606 and decoders 1607.

Figure 17:
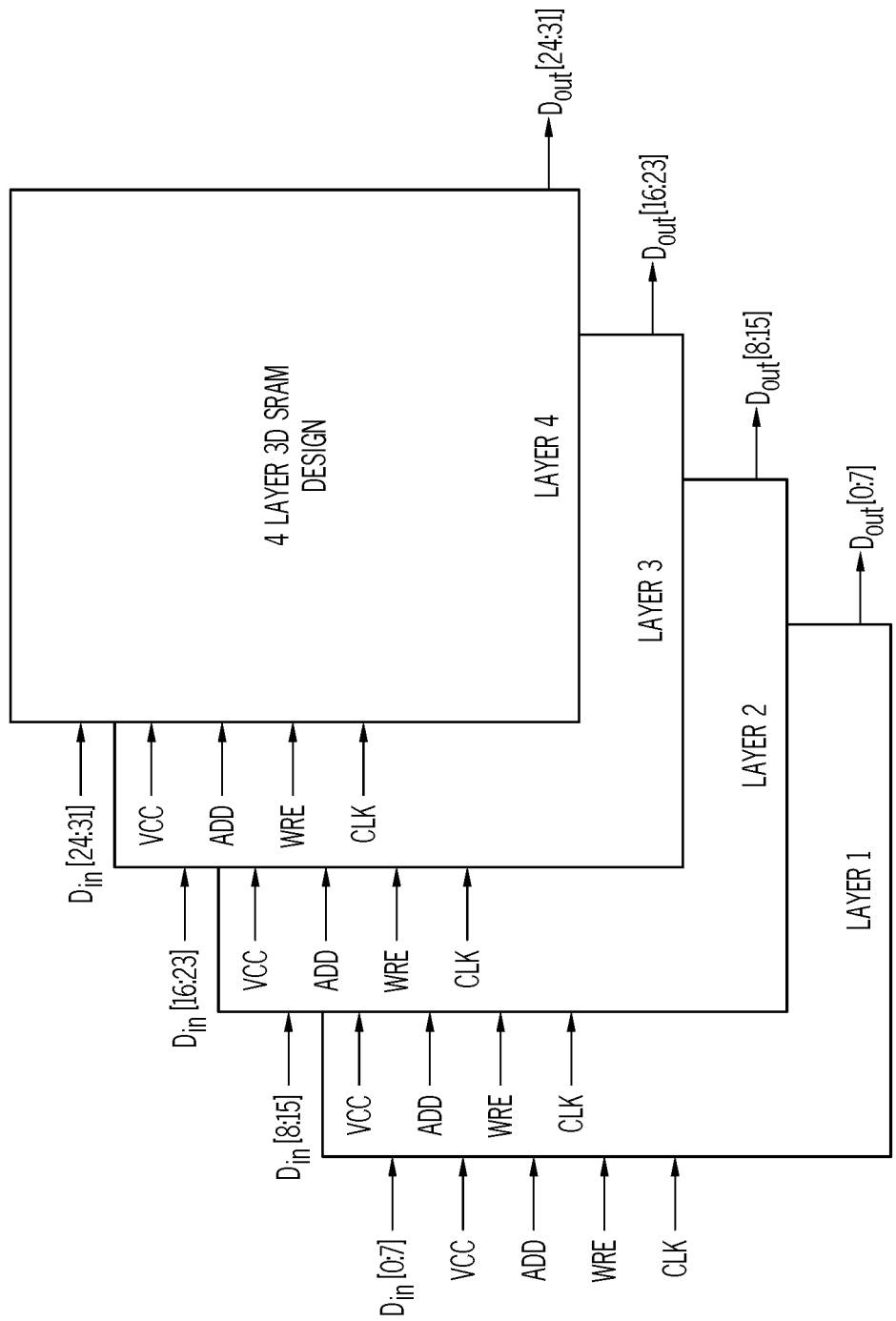
FIG. 17 illustrates 3D stand-alone SRAM die stacking in accordance with an embodiment of the present invention.

Similar to 2D SRAM configurations, 3D SRAM can be designed in multiple configurations as per design needs. The 3D eDRAM is also similar to the 3D SRAM methodology and similar eDRAM configurations can be designed. One of the possible 3D single sided SRAM configurations, shown by FIG. 17, is 3D stacked dies of stand-alone SRAM arrays. FIG. 17 illustrates 3D stand-alone SRAM die stacking in accordance with an embodiment of the present invention.

In this 3D SRAM configuration, each layer implements self-sustainable 2D single sided SRAM. The data input, power and control signals are fed to each 2D SRAM stacked in a 3D configuration and output data signals are obtained from each layer. Combining the data outputs from all layers make the complete 3D SRAM output. For example, as shown in FIG. 17, the 32-bit $D_{in}$ data bus signal is divided into 4 8-bit data bus signals and fed to each of the 4 layers. The data output $D_{out}$ from each layer comprises of 8 bits, and combining it from 4 layers makes a 32-bit output signal.

Figure 18:
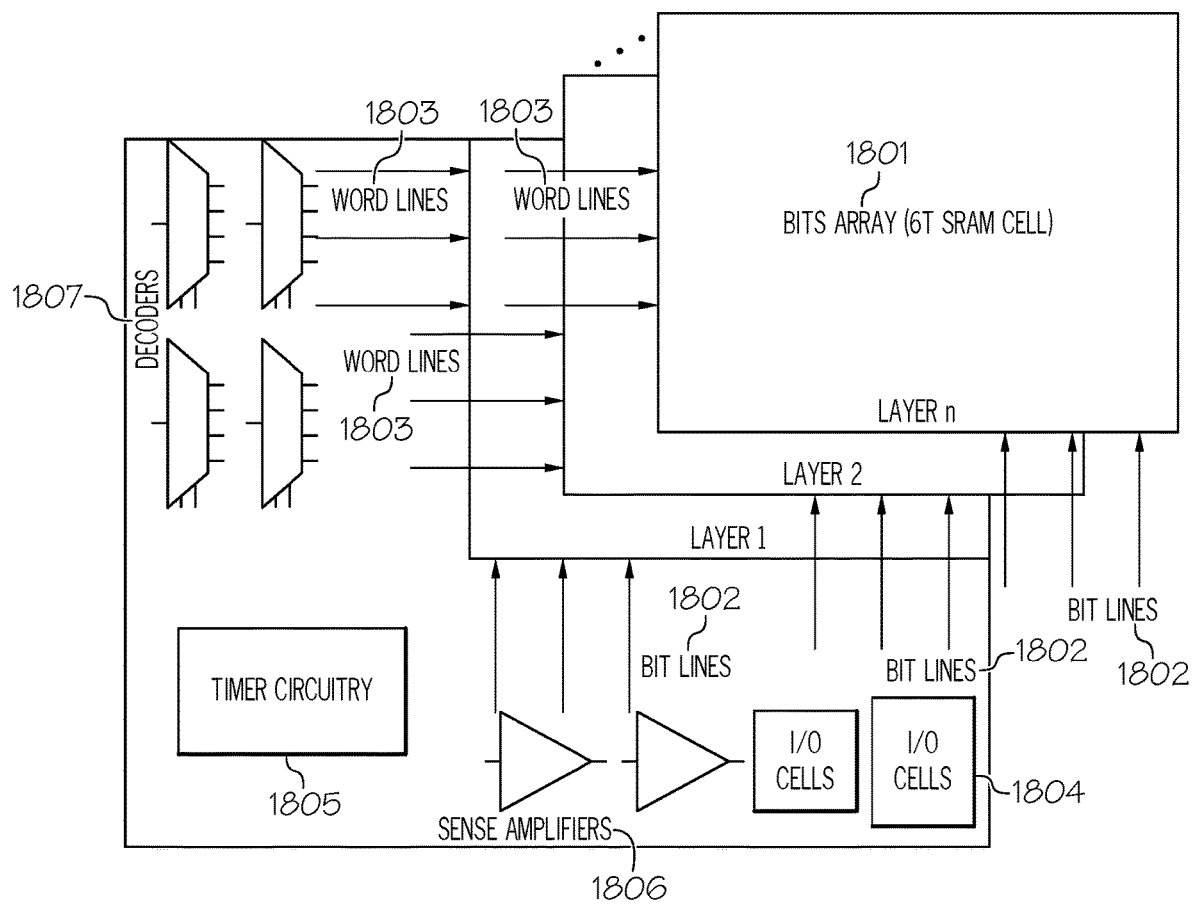
FIG. 18 illustrates a 3D only-bitcell stacked SRAM in accordance with an embodiment of the present invention.

One of the other possible 3D single sided SRAM configurations is a 3D only-bitcell stacked SRAM shown in FIG. 18 in accordance with an embodiment of the present invention.

In this type of 3D SRAM configuration, base layer, i.e., layer 1, comprises of a bitcell array 1801 with bit lines 1802 and word lines 1803, control and periphery circuitry elements, such as IO cells 1804, timer circuitry 1805, sense amplifiers 1806 and decoders 1807. The stacked 3D layers comprise only a bitcell array, bit lines and word lines. In one embodiment, the control circuitry in the base layer for the 3D SRAM is expected to have more column decoders in comparison to the 2D configuration. Similar to the single sided SRAM design, other 2D SRAM configurations, such as butterfly, etc., can be also implemented in 3D.

Figure 19:
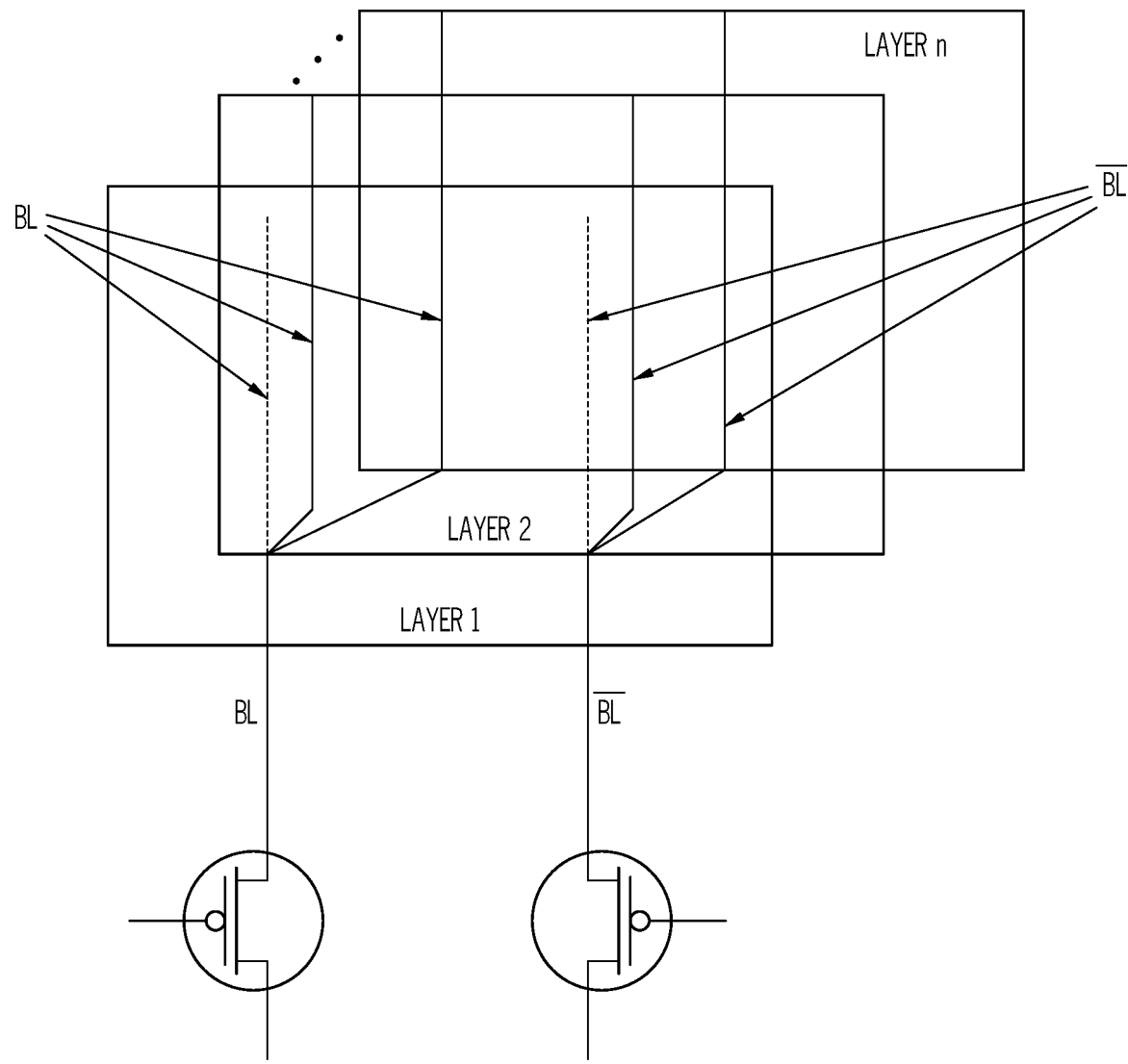
FIG. 19 illustrates the vertical bit-line cross section for the 3D only-bitcell stacked SRAM in accordance with an embodiment of the present invention.

In the 3D only-bitcell style stacked SRAM, there are multiple ways to design it as per design specifications. In one of the configurations, each layer contains the bitcell array with the same size as in the 2D SRAM. In the 3D SRAM, the bit line and word line lengths, bandwidth, footprint, etc. remain the same as 2D SRAM, but memory capacity, i.e., array bitcell density, becomes n times, where n is the number of layers. The slight modification to this design configuration would be to add more sense amplifiers in order to increase the memory bandwidth. FIG. 19 illustrates the vertical bit-line cross section for the 3D only-bitcell stacked SRAM in accordance with an embodiment of the present invention.

As illustrated in FIG. 19, this example does not utilize column decoders to select the bit line layer. However, the memory access time is expected to be reduced because of smaller bit line lengths, which ultimately reduces the time constant RC, where R is the resistance and C is the capacitance. In order to select the bit line for the specific layer, a decoder can be added to this design configuration.

Another possible 3D only-bitcell stacked SRAM design configuration reduces the foot print/area while keeping the memory capacity, i.e., array bitcell density, the same. In this configuration, the first base layer includes control circuitry which is identical to the control circuitry used in the 2D SRAM configuration. The footprint of the bit array, which is typically 70% of the SRAM area in the 2D configuration, can be reduced in the 3D configuration. The bitcell array area can be divided by n, where n (n>1) is the number of bitcell array layers. In this configuration, the bit lines and word lines will be smaller in length, with additional column decoders. However, it is expected that this type of memory configuration would result in less memory access times.

By using the principles of the present invention, it is now possible to fabricate a three-dimensional (3D) stacked integrated circuit. In one embodiment, pick-and-place strategies are used to stack the source wafers with device layers fabricated using standard two-dimensional (2D) semiconductor fabrication technologies. The source wafers may be stacked in either a sequential or parallel fashion. The stacking may be in a face-to-face, face-to-back, back-to-face or back-to-back fashion. The source wafers that are stacked in a face-to-back, back-to-face or back-to-back fashion may be connected using Through Silicon Vias (TSVs). Alternatively, source wafers that are stacked in a face-to-face fashion may be connected using Inter Layer Vias (ILVs).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for assembling die onto a product substrate, the method comprising:

selectively picking one or more die from a source wafer by a superstrate attached to said one or more die;

placing and bonding said selectively picked one or more die onto said product substrate with precision overlay, wherein said precision overlay is enabled by a fluid deployed between said one or more die and said product substrate, wherein said precision overlay comprises a difference between a vector position of points on said one or more die and a vector position of corresponding points on said product substrate.

2. The method as recited in claim 1, wherein said one or more die comprise multiple die.

3. The method as recited in claim 1, wherein said selectively picking and said placing are performed in a massively parallel manner.

4. The method as recited in claim 1, wherein said assembling is performed to achieve one of the following: sub-100 nm, sub-25 nm overlay, sub-10 nm overlay and sub-5 nm overlay precision between said one or more die and said product substrate.

5. The method as recited in claim 1, wherein said precision overlay between said one or more die and said product substrate is achieved using a nanometer overlay metrology scheme.

6. The method as recited in claim 1, wherein said precision overlay between said one or more die and said product substrate is achieved using a moiré metrology scheme.

7. The method as recited in claim 1, wherein said precision overlay between said one or more die and said product substrate is achieved using an IR moiré metrology scheme.

8. The method as recited in claim 1 further comprising:
performing coarse alignment using stage actuators as said selectively picked one or more die are brought to said product substrate; and
performing fine alignment after said one or more die are touching said fluid deployed between said one or more die and said product substrate.

9. The method as recited in claim 1, wherein said fluid comprises one of the following: a gas, a liquid and a combination thereof, wherein said combination comprises disparate gas and liquid portions or portions of a homogenously mixed gas and liquid.

10. The method as recited in claim 1, wherein said fluid comprises air.

11. The method as recited in claim 1, wherein said fluid is comprised of a volatile liquid.

12. The method as recited in claim 1, wherein said fluid comprises an adhesive.

13. The method as recited in claim 12, wherein said one or more die are securely attached onto said product substrate by holding onto said one or more die using said superstrate until said adhesive reaches its gel point.

14. The method as recited in claim 13, wherein said adhesive is cured using ultraviolet light until it reaches said gel point.

15. The method as recited in claim 1, wherein a topography of said one or more die is varied during said placement and bonding using said superstrate.

16. The method as recited in claim 15, wherein said superstrate comprises piezoelectric actuators to enable said topography variation.

17. The method as recited in claim 1, wherein distortion control of said one or more die is utilized to enable said precision overlay.

18. The method as recited in claim 17, wherein said distortion control is enabled by thermal actuators.

19. The method as recited in claim 1, wherein a top surface of said one or more die placed onto said fluid on said product substrate is at a same height or higher than all previously placed die on said product substrate.

20. The method as recited in claim 19, wherein said fluid is a liquid.

21. The method as recited in claim 20, wherein said liquid is an adhesive.

22. The method as recited in claim 20, wherein a thickness of said liquid is varied by using pre-calculated volumes of liquid drops.

23. The method as recited in claim 21, wherein said adhesive shrinks by 2-10% by volume upon reaching a gel point.

24. The method as recited in claim 1, wherein, once said product substrate has been fully populated with die, one or more of a material deposition and a coating is performed, followed by a planarization.

25. The method as recited in claim 24, wherein said planarization utilizes one or more of the following: inkjet-based planarization and chemical mechanical polishing.

26. The method as recited in claim 1, wherein said superstrate incorporates valves to activate vacuum holes on said superstrate to enable vacuum-based pickup and placement.

27. The method as recited in claim 26, wherein said activation of said vacuum holes is performed in an addressable manner.

28. The method as recited in claim 27, wherein said vacuum holes are arranged in substantially a same lattice as said product substrate in its final form.

29. The method as recited in claim 1, wherein a thickness of said one or more die is less than 10 micrometers.

30. The method as recited in claim 29 further comprising:
performing die thinning of said one or more die using back-grinding.

31. The method as recited in claim 1, wherein a scribe width between said one or more die on said source wafer is between 200 nanometers and 10 micrometers.

32. The method as recited in claim 1, wherein a surface activation of said one or more die is performed prior to said assembling to enable said assembling.

33. The method as recited in claim 1, wherein said bonding comprises direct bonding.

34. The method as recited in claim 1, wherein said fluid is comprised of a volatile liquid.

35. The method as recited in claim 1, wherein said fluid comprises an adhesive.

36. The method as recited in claim 35, wherein said one or more die are securely attached onto said product substrate by holding onto said one or more die using said vacuum superstrate until said adhesive reaches its gel point.

37. The method as recited in claim 36, wherein said adhesive is cured using ultraviolet light until it reaches said gel point.

38. A method for assembling die onto a product substrate, the method comprising:
selectively picking one or more die from a source wafer by a vacuum superstrate attached to said one or more die;
placing said selectively picked one or more die onto said product substrate with sub-100 nm placement precision, wherein said sub-100 nm placement precision is enabled by a fluid deployed between said one or more die and said product substrate; and
securely attaching said selectively picked one or more die onto said product substrate using direct bonding by holding onto said one or more die using said vacuum superstrate until said attachment occurs.

39. The method as recited in claim 38, wherein said one or more die comprise multiple die.

40. The method as recited in claim 38, wherein said selectively picking and said placing are performed in a massively parallel manner.

41. The method as recited in claim 38, wherein said assembling is performed to achieve one of the following: sub-100 nm, sub-25 nm overlay, sub-10 nm overlay and sub-5 nm overlay precision between said one or more die and said product substrate.

42. The method as recited in claim 38, wherein a precision overlay between said one or more die and said product substrate is achieved using a nanometer overlay metrology scheme.

43. The method as recited in claim 38, wherein a precision overlay between said one or more die and said product substrate is achieved using a moiré metrology scheme.

44. The method as recited in claim 38, wherein a precision overlay between said one or more die and said product substrate is achieved using an IR moiré metrology scheme.

45. The method as recited in claim 38 further comprising:
performing coarse alignment using stage actuators as said selectively picked one or more die are brought to said product substrate; and
performing fine alignment after said one or more die are touching said fluid deployed between said one or more die and said product substrate.

46. The method as recited in claim 38, wherein said fluid comprises one of the following: a gas, a liquid and a combination thereof, wherein said combination comprises disparate gas and liquid portions or portions of a homogenously mixed gas and liquid.

47. The method as recited in claim 38, wherein said fluid comprises air.

48. The method as recited in claim 38, wherein a topography of said one or more die is varied during said placement using said vacuum superstrate.

49. The method as recited in claim 48, wherein said vacuum superstrate comprises piezoelectric actuators to enable said topography variation.

50. The method as recited in claim 38, wherein distortion control of said one or more die is utilized to enable precision overlay.

51. The method as recited in claim 50, wherein said distortion control is enabled by thermal actuators.

52. The method as recited in claim 38, wherein a top surface of said one or more die placed onto said fluid on said product substrate is at a same height or higher than all previously placed die on said product substrate.

53. The method as recited in claim 52, wherein said fluid is a liquid.

54. The method as recited in claim 53, wherein said liquid is an adhesive.

55. The method as recited in claim 53, wherein a thickness of said liquid is varied by using pre-calculated volumes of liquid drops.

56. The method as recited in claim 54, wherein said adhesive shrinks by 2-10% by volume upon reaching a gel point.

57. The method as recited in claim 38, wherein, once said product substrate has been fully populated with die, one or more of a material deposition and a coating is performed, followed by a planarization.

58. The method as recited in claim 57, wherein said planarization utilizes one or more of the following: inkjet-based planarization and chemical mechanical polishing.

59. The method as recited in claim 38, wherein said vacuum superstrate incorporates valves to activate vacuum holes on said vacuum superstrate to enable vacuum-based pickup and placement.

60. The method as recited in claim 59, wherein said activation of said vacuum holes is performed in an addressable manner.

61. The method as recited in claim 60, wherein said vacuum holes are arranged in substantially a same lattice as said product substrate in its final form.

62. The method as recited in claim 38, wherein a thickness of said one or more die is less than 10 micrometers.

63. The method as recited in claim 62 further comprising:
performing die thinning of said one or more die using back-grinding.

64. The method as recited in claim 38, wherein a scribe width between said one or more die on said source wafer is between 200 nanometers and 10 micrometers.

65. The method as recited in claim 38, wherein a surface activation of said one or more die is performed prior to said assembling to enable said assembling.

* * * * *